United States Patent
Chang et al.

(10) Patent No.: US 10,700,092 B2
(45) Date of Patent: Jun. 30, 2020

(54) VERTICAL SEMICONDUCTOR DEVICES AND METHODS OF MANUFACTURING THE SAME

(71) Applicant: SAMSUNG ELECTRONICS CO., LTD., Suwon-si (KR)

(72) Inventors: Sung-Il Chang, Hwaseong-si (KR); Jun-Hee Lim, Seoul (KR); Yong-Seok Kim, Suwon-si (KR); Tae-Young Kim, Seoul (KR); Jae-Sung Sim, Hwaseong-si (KR); Su-Jin Ahn, Seoul (KR); Ji-Yeong Hwang, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/441,163

(22) Filed: Jun. 14, 2019

(65) Prior Publication Data

US 2019/0296047 A1    Sep. 26, 2019

Related U.S. Application Data

(63) Continuation of application No. 15/288,517, filed on Oct. 7, 2016, now Pat. No. 10,367,002.

(30) Foreign Application Priority Data

Oct. 8, 2015    (KR) .......................... 10-2015-0141663

(51) Int. Cl.
*H01L 27/11582*    (2017.01)
*H01L 27/11578*    (2017.01)
(Continued)

(52) U.S. Cl.
CPC .. *H01L 27/11582* (2013.01); *H01L 21/26513* (2013.01); *H01L 27/1157* (2013.01);
(Continued)

(58) Field of Classification Search
CPC ........... H01L 27/11582; H01L 27/1157; H01L 29/66833
See application file for complete search history.

(56) References Cited

U.S. PATENT DOCUMENTS

| 2010/0224929 A1 | 9/2010 | Jeong et al. |
| 2012/0235221 A1 | 9/2012 | Ishiduki et al. |

(Continued)

FOREIGN PATENT DOCUMENTS

| KR | 1020130086778 A | 8/2013 |
| KR | 1020150028885 A | 3/2015 |

OTHER PUBLICATIONS

Notice of Allowance dated Mar. 26, 2019 issued in parent U.S. Appl. No. 15/288,517.

(Continued)

*Primary Examiner* — Selim U Ahmed
*Assistant Examiner* — Evan G Clinton
(74) *Attorney, Agent, or Firm* — Sughrue Mion, PLLC

(57) ABSTRACT

In a method of manufacturing a vertical semiconductor device, an insulation layer and a sacrificial layer are alternatively and repeatedly formed on a substrate to define a structure. The structure is etched to form a hole therethrough that exposes the substrate. A first semiconductor pattern is formed in a lower portion of the hole, and a blocking pattern, a charge storage pattern, a tunnel insulation pattern and a first channel pattern are formed on a sidewall of the hole. A second channel pattern is formed on the first channel pattern and the semiconductor pattern, and a second semiconductor pattern is formed on a portion of the second channel pattern on the semiconductor pattern to define an upper channel pattern including the second channel pattern and the second (Continued)

semiconductor pattern. The sacrificial layers are replaced with a plurality of gates, respectively, including a conductive material.

20 Claims, 36 Drawing Sheets

(51) Int. Cl.
    *H01L 29/66*     (2006.01)
    *H01L 29/78*     (2006.01)
    *H01L 27/1157*     (2017.01)
    *H01L 21/265*     (2006.01)
    *H01L 27/11556*     (2017.01)

(52) U.S. Cl.
    CPC .. *H01L 27/11556* (2013.01); *H01L 27/11578* (2013.01); *H01L 29/66666* (2013.01); *H01L 29/66833* (2013.01); *H01L 29/7827* (2013.01)

(56) References Cited

U.S. PATENT DOCUMENTS

| | | |
|---|---|---|
| 2015/0017772 A1 | 1/2015 | Waite et al. |
| 2015/0076580 A1 | 3/2015 | Pachamuthu et al. |
| 2015/0076586 A1 | 3/2015 | Rabkin et al. |
| 2015/0104916 A1 | 4/2015 | Lee et al. |
| 2015/6145020 | 5/2015 | Kim et al. |
| 2015/0200203 A1 | 7/2015 | Jang et al. |
| 2016/0027796 A1 | 1/2016 | Yang et al. |
| 2016/0315095 A1 | 10/2016 | Sel et al. |
| 2016/0351582 A1 | 12/2016 | Kim et al. |

OTHER PUBLICATIONS

Office Action dated Dec. 13, 2018 issued in parent U.S. Appl. No. 15/288,517.

Office Action dated May 11, 2018 issued in parent U.S. Appl. No. 15/288,517.

Office Action dated Sep. 22, 2017 issued in parent U.S. Appl. No. 15/288,517.

VERTICAL SEMICONDUCTOR DEVICES AND METHODS OF MANUFACTURING THE SAME

CROSS-REFERENCE TO RELATED APPLICATION

This is a continuation of U.S. application Ser. No. 15/288,517 filed on Oct. 7, 2016, which claims priority under 35 USC § 119 to Korean Patent Application No. 10-2015-0141663, filed on Oct. 8, 2015 in the Korean Intellectual Property Office (KIPO), the disclosures of which are herein incorporated by reference in their entirety.

BACKGROUND

1. Field

Some embodiments relate to vertical semiconductor devices and methods of manufacturing the same. More particularly, some embodiments relate to vertical NAND flash memory devices and methods of manufacturing the same.

2. Description of the Related Art

In a vertical memory device, a channel structure may be formed on a substrate so that the channel structure extends in a direction that is substantially perpendicular to an upper surface of the substrate. For improved device performance, it is desirable for the channel structure to have a uniform channel resistance throughout all portions thereof. It is also desirable for the channel structure to have a low resistance and to be electrically connected to the substrate.

SUMMARY

Some embodiments provide methods of manufacturing a vertical semiconductor device having good electrical characteristics.

Some embodiments provide vertical semiconductor devices having good electrical characteristics.

According to some embodiments, there is provided a method of manufacturing a semiconductor device. In the method, a plurality of insulation layers and sacrificial layers are alternately and repeatedly formed on a substrate to define a structure. The structure is etched to form a hole therethrough exposing the substrate. A first semiconductor pattern is formed on the substrate in a lower portion of the hole. A blocking pattern, a charge storage pattern, a tunnel insulation pattern and a first channel pattern may be sequentially formed on a sidewall of the hole. A second channel pattern is formed on the first channel pattern and the first semiconductor pattern. A second semiconductor pattern is formed on a portion of the second channel pattern on the first semiconductor pattern to define an upper channel pattern including the second channel pattern and the second semiconductor pattern. The sacrificial layers are replaced with a plurality of gates, respectively, including a conductive material.

In some embodiments, when the second semiconductor pattern is formed, silicon ions may be implanted onto the second channel pattern in a direction substantially perpendicular to an upper surface of the substrate.

In some embodiments, the second channel pattern may directly contact an upper surface of the first semiconductor pattern, and the second semiconductor pattern may be formed by implanting silicon ions onto the second channel pattern.

In some embodiments, when the second channel pattern is formed, a preliminary second channel layer may be formed on the first channel pattern and the first semiconductor pattern to directly contact the upper surface of the first semiconductor pattern. A surface of the preliminary second channel may be partially etched by a trimming process to form the second channel pattern.

In some embodiments, when the second channel pattern and the second semiconductor pattern are formed, a preliminary second channel layer may be formed on the first channel pattern and the first semiconductor pattern to directly contact an upper surface of the first semiconductor pattern. The silicon ions may be implanted onto the preliminary second channel layer to form a preliminary second semiconductor layer. A surface of the preliminary second channel layer and the preliminary second semiconductor layer may be partially etched by a trimming process to form the second channel pattern and the second semiconductor pattern, respectively.

In some embodiments, the second semiconductor pattern may directly contact an upper surface of the first semiconductor pattern, and the second channel pattern may be formed on the second semiconductor pattern.

In some embodiments, the silicon ions may be implanted with an implant dose of about $1.0E14/cm^2$ to about $1.0E17/cm^2$.

In some embodiments, the second semiconductor pattern may directly contact an upper surface of the first semiconductor pattern, and the second semiconductor pattern may be formed on the first semiconductor pattern by an selective epitaxial growth process.

In some embodiments, an upper surface of the upper channel pattern on the first semiconductor pattern may be higher than a lower surface of the first channel pattern.

In some embodiments, the first channel pattern and the upper channel pattern may serve as a channel structure, and a first thickness of a portion of the channel structure on the first semiconductor pattern may be greater than a second thickness of a portion of the channel structure on the sidewall of the hole.

In some embodiments, when the blocking pattern, the charge storage pattern, the tunnel insulation pattern and the first channel pattern may be formed, a blocking layer, a charge storage layer, a tunnel insulation layer and a first channel layer may be conformally and sequentially formed on the sidewall and a bottom of the hole and an uppermost one of the insulation layers. The blocking layer, the charge storage layer, the tunnel insulation layer and the first channel layer may be anisotropically etched to expose the upper surface of the first semiconductor pattern.

In some embodiments, the second semiconductor pattern may include amorphous silicon or crystalline silicon.

In a method of manufacturing a semiconductor device according to further embodiments, an insulation layer and a sacrificial layer may be alternately and repeatedly formed on a substrate to define a structure. The structure may be etched to form a hole therethrough exposing the substrate. A semiconductor pattern may be formed on the substrate in a lower portion of the hole. A blocking pattern, a charge storage pattern, a tunnel insulation pattern and a first channel pattern may be sequentially formed on a sidewall of the hole. A channel structure may be formed on the tunnel insulation pattern and the semiconductor pattern. A portion of the channel structure on the first semiconductor pattern may have a first thickness, and a portion of the channel structure on the tunnel insulation pattern may have a second thickness less than the first thickness. The sacrificial layers may be replaced with a plurality of gates, respectively, including a conductive material.

In some embodiments, the channel structure may include a first channel pattern, a second channel pattern and a silicon pattern. When the silicon pattern is formed, the first channel pattern may be formed on the tunnel insulation pattern. The second channel pattern may be formed on the first channel pattern and the semiconductor pattern. The silicon pattern contacting a portion of the second channel pattern on the semiconductor pattern may be formed to define an upper channel pattern including the second channel pattern and the silicon pattern.

In some embodiments, when the silicon pattern is formed, silicon ions may be implanted in a direction substantially perpendicular to an upper surface of the substrate.

According to some embodiments, there is provided a semiconductor device. The semiconductor device includes a plurality of insulation patterns and a plurality of gates, a channel pattern, a semiconductor pattern, a blocking pattern, a charge storage pattern, a tunnel insulation pattern and a first channel pattern sequentially stacked and an upper channel pattern. The insulation patterns and the plurality of gates may be alternately and repeatedly stacked formed on a substrate. A hole may be formed through the insulation patterns and the gates, and may expose the substrate. A semiconductor pattern may fill a lower portion of the hole on the substrate. A blocking pattern, a charge storage pattern, a tunnel insulation pattern and a first channel pattern sequentially stacked may be formed on a sidewall of the hole. The upper channel pattern may include a second channel pattern and a silicon pattern. The second channel pattern may be formed on the first channel pattern and the semiconductor pattern, and the silicon pattern may contact a portion of the second channel pattern on the semiconductor pattern.

In some embodiments, the second channel pattern may directly contact an upper surface of the semiconductor pattern, and the silicon pattern may be formed on the second channel pattern.

In some embodiments, the second channel pattern may directly contact an upper surface of the semiconductor pattern, and the second channel pattern may be formed on the silicon pattern.

In some embodiments, an upper surface of the upper channel pattern on the semiconductor pattern may be higher than a lower surface of the first channel pattern.

In some embodiments, the silicon pattern may include amorphous silicon or crystalline silicon.

A method of manufacturing a vertical semiconductor device according to further embodiments includes forming a preliminary vertical channel structure including alternating plurality of insulation layers and sacrificial layers on a substrate, forming a hole in the structure that extends through the plurality of insulation layers and sacrificial layers to the substrate, forming a first semiconductor pattern on the substrate in a lower portion of the hole, and sequentially forming a blocking pattern, a charge storage pattern, a tunnel insulation pattern and a first channel pattern on a sidewall of the hole and an upper surface of the first semiconductor pattern. The blocking pattern, the charge storage pattern, the tunnel insulation pattern and the first channel pattern are anisotropically etched to expose the upper surface of the first semiconductor pattern, and the method further includes forming a second channel pattern on the first channel pattern and the exposed upper surface of the first semiconductor pattern, forming a second semiconductor pattern on a portion of the second channel pattern over the upper surface of the first semiconductor pattern to define an upper channel pattern including the second channel pattern and the second semiconductor pattern, and replacing the sacrificial layers with a plurality of gates, respectively, including a conductive material.

According to some embodiments, in the vertical semiconductor device, a height of bottom of the channel pattern may increase so that the channel pattern may fully cover a lower sidewall of charge storage pattern. In the vertical semiconductor device, an effective thickness of lower surface of the channel pattern may increase, so that a resistance between the channel pattern and the semiconductor pattern and/or substrate may decrease. Thus, a disconnection between the channel structure and the semiconductor pattern and/or substrate may be avoided.

BRIEF DESCRIPTION OF THE DRAWINGS

Some embodiments will be more clearly understood from the following detailed description taken in conjunction with the accompanying drawings.

FIG. 1 is a cross-sectional view illustrating a vertical semiconductor device in accordance with some embodiments.

FIGS. 2 to 16 are cross-sectional views illustrating stages of methods of manufacturing a vertical semiconductor device in accordance with some embodiments.

FIGS. 17 to 19 are cross-sectional views illustrating stages of methods of manufacturing a vertical semiconductor device in accordance with some embodiments.

FIGS. 20 to 22 are cross-sectional views illustrating stages of methods of manufacturing a vertical semiconductor device in accordance with some embodiments.

FIGS. 23 to 27 are cross-sectional views illustrating stages of methods of manufacturing a vertical semiconductor device in accordance with some embodiments.

FIGS. 28 and 29 are cross-sectional views illustrating stages of methods of manufacturing a vertical semiconductor device in accordance with some embodiments.

FIGS. 30 and 31 are cross-sectional views illustrating stages of methods of manufacturing a vertical semiconductor device in accordance with some embodiments.

FIGS. 32 to 36 are cross-sectional views illustrating stages of methods of manufacturing a vertical semiconductor device in accordance with some embodiments.

DESCRIPTION OF EMBODIMENTS

Figure 1:
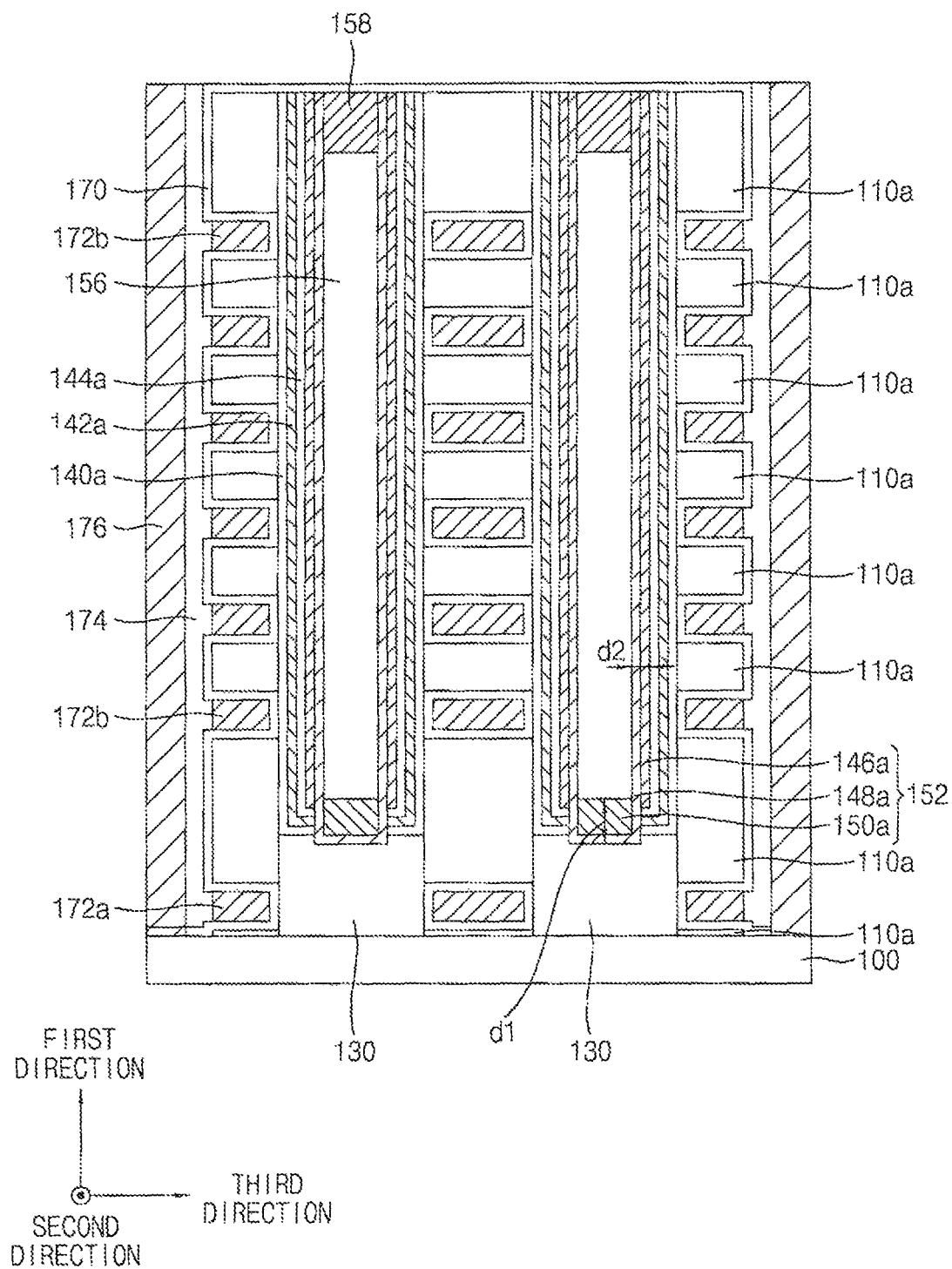
FIGS. 1 to 36 represent non-limiting, some embodiments as described herein.

Various some embodiments will be described more fully hereinafter with reference to the accompanying drawings, in which some embodiments are shown. The present inventive concept may, however, be embodied in many different forms and should not be construed as limited to the some embodiments set forth herein. Rather, these some embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular some embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some embodiments are described herein with reference to cross-sectional illustrations that are schematic illustrations of idealized some embodiments (and intermediate structures). As such, variations from the shapes of the illustrations as a result, for example, of manufacturing techniques and/or tolerances, are to be expected. Thus, some embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a vertical semiconductor device in accordance with some embodiments.

In all figures in this specification, a direction substantially perpendicular to a top surface of a substrate is referred to as a first direction, and two directions substantially parallel to the top surface of the substrate and substantially perpendicular to each other are referred to as a second direction and a third direction, respectively. Additionally, a direction indicated by an arrow in the figures and a reverse direction thereto is considered as the same direction.

Referring to FIG. 1, a plurality of gates 172a and 172b and a plurality of first insulation patterns 110a may be alternately and repeatedly formed on a substrate 100. The gates 172a and 172b and the first insulation pattern 110a may include a hole therethrough exposing the substrate 100. A semiconductor pattern 130 may fill a lower portion of the hole. A first blocking pattern 140a, a charge storage pattern 142a, a tunnel insulation pattern 144a and a first channel pattern 146a may be sequentially formed on a sidewall of the hole. A second channel pattern 148a may be formed on the first channel pattern 146a and the semiconductor pattern 130. A silicon pattern 150a may contact the second channel pattern 146a formed on the semiconductor pattern 130. The second channel pattern 148a and the semiconductor pattern 130 are referred to as an upper channel pattern. The first and second channel patterns 146a and 148a and the silicon pattern 150a may serve as a channel structure 152.

The substrate 100 may include a semiconductor material, e.g., silicon, germanium, etc.

The semiconductor pattern 130 may have a pillar shape. In some embodiments, the semiconductor pattern 130 may include a single crystalline material, e.g., single crystalline silicon. Alternatively, the semiconductor pattern 130 may include polysilicon. The semiconductor pattern 130 may be doped with impurities. In some embodiments, an upper surface of the semiconductor pattern 130 may be substantially flat. In some embodiments, the upper surface of the semiconductor pattern 130 may have a protruding portion.

The tunnel insulation pattern 144a, the charge storage pattern 142a, the first blocking pattern 140a may be sequentially stacked on the sidewall of the hole and the semiconductor pattern 130. Each of the tunnel insulation pattern 144a, the charge storage pattern 142a, and the first blocking pattern 140a may have a first portion and a second portion. The first portions may be formed on the sidewall of the hole, and may extend in the first direction. The second portions may be disposed under a lower surface of the first channel pattern 146a, and may extend in a direction substantially parallel to the upper surface of the semiconductor pattern 130. The second portions of the first blocking pattern 140a, the charge storage pattern 142a and the tunnel insulation pattern 144a may be exposed by a lower sidewall of the hole.

The channel structure 152 may be formed on the first portion of the tunnel insulation pattern 144a, the second portions of the tunnel insulation pattern 144a, the charge storage pattern 142a and the first blocking pattern 140a, and the semiconductor pattern 130.

In some embodiments, the channel structure 152 may have a cup shape, and may contact the upper surface of the semiconductor pattern 130. A filling insulation pattern 156 may be formed on the channel structure 152, and may fill an inner space formed by the channel structure 152 having the cup shape.

In some embodiments, the first and second channel patterns 146a and 148a may include doped or undoped polysilicon. In some embodiments, the silicon pattern 150a may be formed by implanting ions including silicon, e.g., silicon ions. For example, an implantation process of silicon ions or a doping process of silicon ions may be performed to form the silicon pattern 150a. In the implantation process of silicon ions, an implant dose may be about $1.0E14/cm^2$ to about $1.0E17/cm^2$, and an implant energy may be about 1 keV to about 10 keV. The silicon pattern 150a may include amorphous silicon or crystalline silicon.

The first channel pattern 146a may be formed on the first portion of the tunnel insulation pattern 144a. The second channel pattern 148a may be conformally formed on the second portions of the tunnel insulation pattern 144a, the charge storage pattern 142a and the first blocking pattern 140a, and the semiconductor pattern 130. The silicon pattern 150a may be formed on the second channel pattern 148a on the semiconductor pattern 130.

In some embodiments, the silicon pattern 150a may completely cover the second portions of the first blocking pattern 140a, the charge storage pattern 142a and the tunnel insulation pattern 144a. An upper surface of the silicon pattern 150a may be higher than a lower surface of the first channel pattern 146a.

That is, the channel structure 152 on the semiconductor pattern 130 may include the second channel pattern 148a and the silicon pattern 150a which are sequentially stacked, and which may have a first thickness d1 in the first direction from the semiconductor pattern 130. The channel structure 152 on the tunnel insulation pattern 144a may include the first and second channel patterns 146a and 148a which are sequentially stacked, and may have a second thickness d2 in the third direction from the tunnel insulation pattern 144a. The first thickness d1 may be substantially the same as or greater than the second thickness d2.

The second channel pattern 148a and the silicon pattern 150a may be formed on the semiconductor pattern 130, so that a connecting portion between the semiconductor pattern 130 and the channel structure 152 may not be locally thinned. Thus, the semiconductor pattern 130 and the channel structure 152 may not be disconnected from each other, so that a channel resistance between the semiconductor pattern 130 and the channel structure 152 may not increase.

In some embodiments, the tunnel insulation pattern 144a may include an oxide, e.g., silicon oxide. The charge storage pattern 142a may include a nitride, e.g., silicon nitride. The first blocking pattern 140a may include an oxide, e.g., silicon oxide.

In some embodiments, the gates 172a and 172b may include a first gate 172a and a plurality of second gates 172b. The first gate 172a may extend in the second direction, and may surround the semiconductor pattern 130. Each of the second gates 172b may extend in the second direction, and may surround the channel structure 152.

The first gate 172a may serve as a ground selection line (GSL). In some embodiments, one first gate 172a may surround the semiconductor pattern 130. In some embodiments, a plurality of first gates 172a may be formed to be spaced apart from each other in the first direction, and each of the first gates 172a may surround the semiconductor pattern 130.

Each of the second gates 172b may serve as a word line or a string selection line (SSL). In some embodiments, one SSL or a plurality of SSLs may be formed on an upper sidewall of the channel structure 152. A plurality of word lines may be formed between the GSL and the SSL.

A first distance in the first direction between the first and second gates 172a and 172b may be greater than a second distance in the first direction between adjacent ones of the second gates 172b.

In some embodiments, the first and second gates 172a and 172b may include a metal having a low resistance, e.g., tungsten, titanium, tantalum, platinum, etc., and/or a metal nitride, e.g., titanium nitride, tantalum nitride, etc. The first and second gates 172a and 172b may include substantially the same material.

In some embodiments, a second blocking layer 170 may be formed between the first gate 172a and the semiconductor pattern 130 and between the second gate 172b and the first blocking pattern 140a. The second blocking layer 170 may include a metal oxide having a dielectric constant higher than a dielectric constant of the first blocking pattern 140a. The second blocking layer 170 may cover surfaces of the first and second gates 172a and 172b, and may extend in the first direction.

In some embodiments, the second blocking layer 170 may include, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The first insulation pattern 110a may be formed between the first and second gates 172a and 172b and between the second gates 172b.

The first and second gates 172a and 172b extending in the second direction may be divided by a first opening extending in the second direction. A second insulation pattern 174 may be formed on a sidewall of the first opening. The second insulation pattern 174 may include, e.g., silicon oxide.

A second opening may be defined by the second insulation pattern 174, and a conductive pattern 176 may be formed on the substrate 100 to fill the second opening. The conductive pattern 176 may include a metal having a low resistance, e.g., tungsten, titanium, tantalum, platinum, etc., and/or a metal nitride, e.g., titanium nitride, tantalum nitride, etc.

The conductive pattern 176 may serve as a common source line (CSL). An impurity region may be formed at an upper portion of the substrate 100 contacting the conductive pattern 176.

A pad 158 may be formed on the filling insulation pattern 156. A bit line contact plug (not shown) may be formed on the pad 158, and a bit line (not shown) may be formed on the bit line contact plug.

In the vertical semiconductor device, the semiconductor pattern 130 and the channel structure 152 may not be disconnected from each other, so that a channel resistance between the semiconductor pattern 130 and the channel structure 152 may not increase.

FIGS. 2 to 16 are cross-sectional views illustrating stages of methods of manufacturing a vertical semiconductor device in accordance with some embodiments. FIGS. 6, 7, 8, 10 and 12 are enlarged views of a portion of the vertical semiconductor device.

Figure 2:
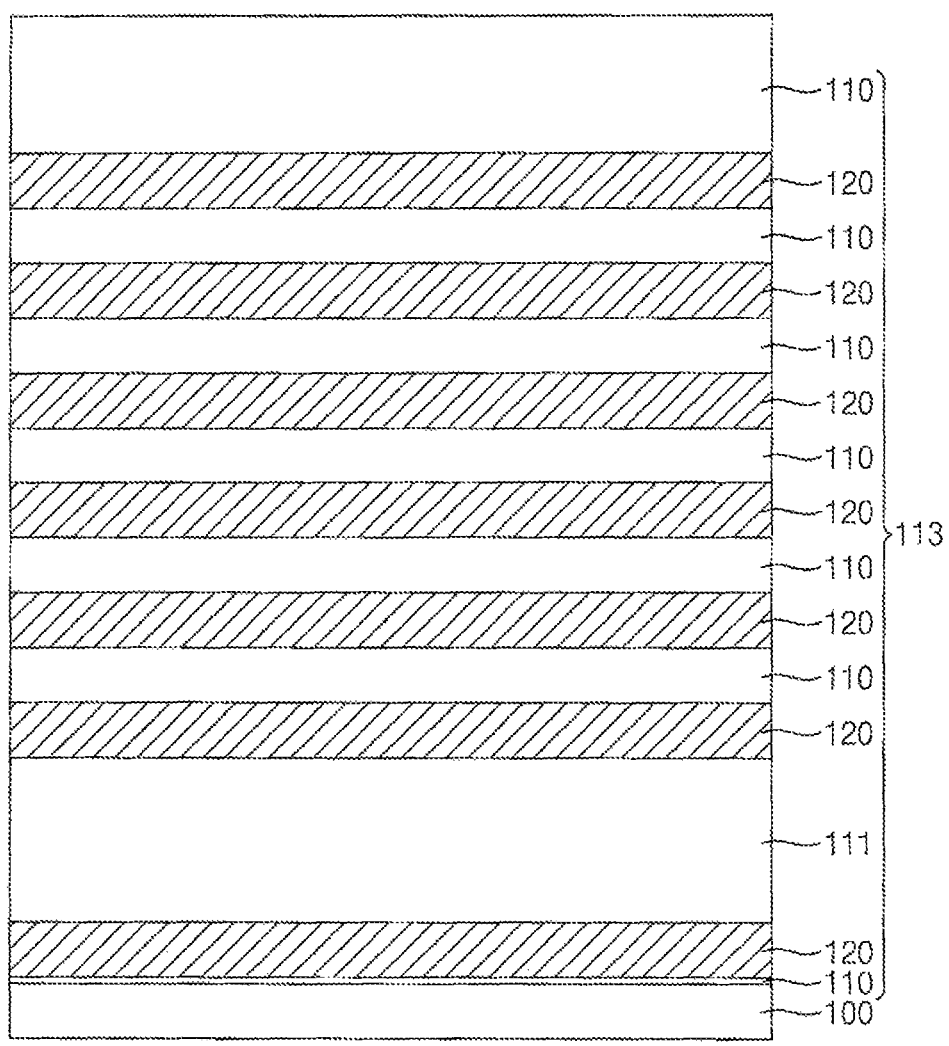

Referring to FIG. 2, a plurality of first insulation layers 110 and a plurality of first sacrificial layers 120 may be repeatedly and alternately formed on the substrate 100 to form a mold structure 113.

The substrate 100 may include a semiconductor material, for example, silicon and/or germanium.

In some embodiments, the first insulation layer 110 and the first sacrificial layer 120 may be formed by a chemical vapor deposition (CVD) process, a plasma enhanced chemical vapor deposition (PE-CVD) process, an atomic layer deposition (ALD) process, etc. One of the first insulation layers 110 directly contacting the substrate 100 may be formed by a thermal oxidation process.

In some embodiments, the first insulation layer 110 may be formed of, e.g., silicon oxide. In some embodiments, the first sacrificial layer 120 may include a material having an etching selectivity with respect to the first insulation layer 110. The first sacrificial layers 120 may be formed of, e.g., silicon nitride.

A plurality of gates may be formed in spaces in which the first sacrificial layers 120 are formed by a subsequent process. Thus, the number of the first sacrificial layers 120 in the first direction may be equal to the number of the gates in the first direction subsequently formed. That is, each of the first sacrificial layers 120 may be replaced with one of a GSL, word lines and a SSL by a subsequent process.

One of the first insulation layers 110 between one of the first sacrificial layers 120 for forming the GSL and one of the first sacrificial layers 120 for forming a lowermost word line may correspond to a connected portion between a semiconductor pattern 130 (refer to FIG. 3) and a channel structure 152 (refer to FIGS. 11 and 12), which may have a thickness greater than thicknesses of other ones of the first insulation layers 110.

At least one GSL may be formed in a space in which a lowermost one of the first sacrificial layers 120 is formed by a subsequent process. If a cell string includes one GSL, one of the first insulation layers 110 directly contact an upper surface of a lowermost one of the first sacrificial layers 120 may have a thickness greater than thicknesses of other ones of the first insulation layers 110.

In some embodiments, an uppermost one of the first insulation layers 110 of the mold structure may be formed to have a thickness greater than thicknesses of other ones of the first insulation layers 110.

Figure 3:
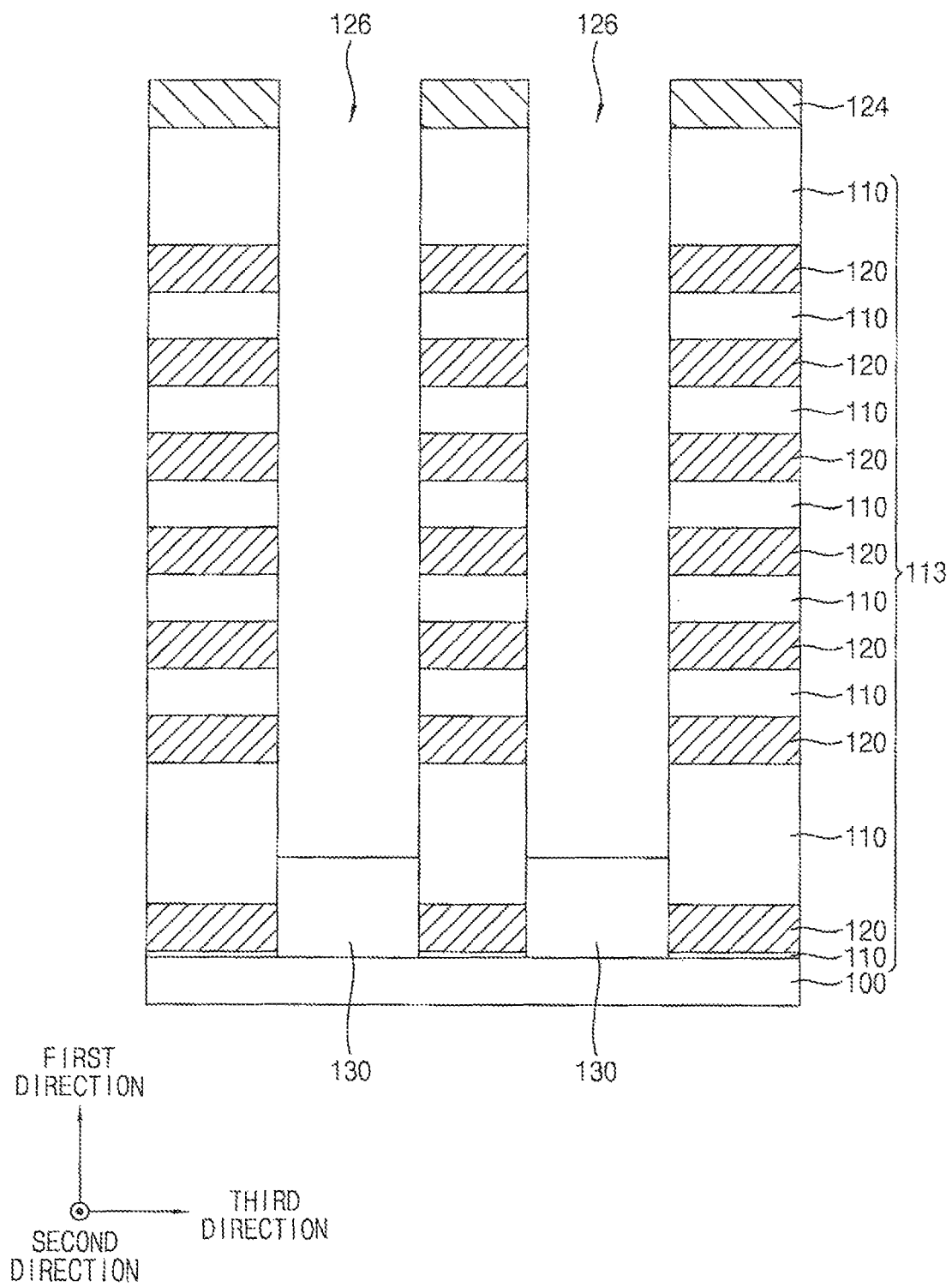

Referring to FIG. 3, a plurality of holes 126 may be formed through the first insulation layers 110 and the first sacrificial layers 120 to expose an upper surface of the substrate 100. The semiconductor pattern 130 may be formed to fill a lower portion of each of the holes 126.

In some embodiments, a hard mask 124 may be formed on the uppermost one of the first insulation layers 110, and the first insulation layers 110 and the first sacrificial layers 120 may be anisotropically etched using the hard mask 124 as an etching mask to form the holes 126. In some embodiments, the holes 126 may be formed in the second and the third directions to define a hole array.

The semiconductor pattern 130 may be formed by a selective epitaxial growth (SEG) process using the exposed upper surface of the substrate 100 as a seed. Thus, the semiconductor pattern 130 may include single crystalline silicon according to the material of the substrate 100. The semiconductor pattern 130 may be doped with impurities. Alternatively, an amorphous silicon layer may be formed to partially fill the holes 126, and a laser epitaxial growth (LEG) process or a solid phase epitaxy (SPE) process may be further performed on the amorphous silicon layer to form the semiconductor pattern 130.

In some embodiments, an upper surface of the semiconductor pattern 130 may be higher than an upper surface of one of the first sacrificial layers 120 for forming the GSL. Also, the upper surface of the semiconductor pattern 130 may be lower than a lower surface of one of the first sacrificial layers 120 for forming the lowermost one of the word lines. In some embodiments, when one GSL is formed, the upper surface of the semiconductor pattern 130 may be positioned between an upper surface of the lowermost one of the first sacrificial layers 120 and a lower surface of one of the first sacrificial layers 120 adjacent thereto.

Figure 4:
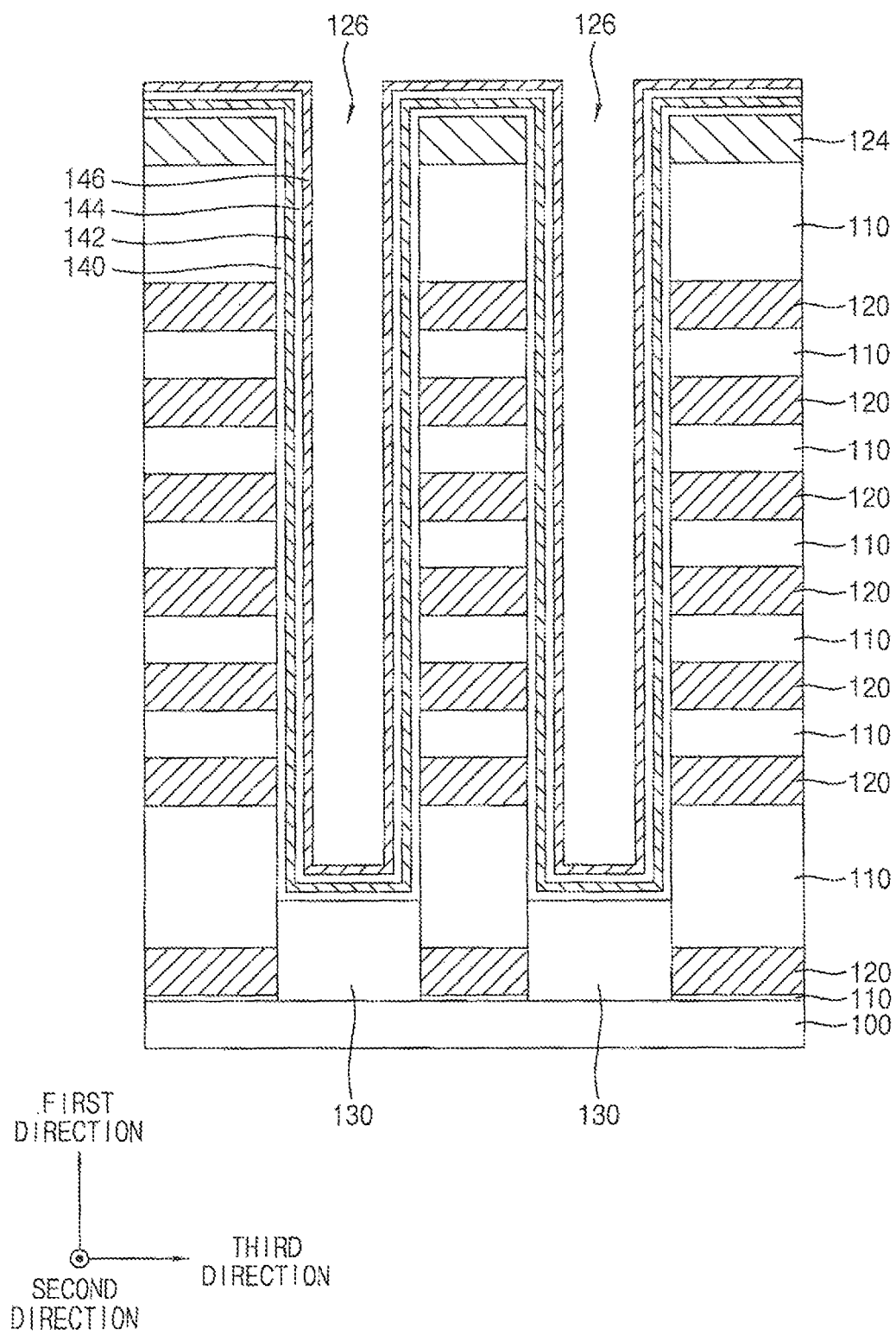

Referring to FIG. 4, a blocking layer 140, a charge storage layer 142, a tunnel insulation layer 144 and a first channel layer 146 may be sequentially and conformally formed on sidewalls of the holes 126, the upper surface of the semiconductor pattern 130 and the hard mask 124.

In some embodiments, the blocking layer 140 may be formed of an oxide, e.g., silicon oxide, the charge storage layer 142 may be formed of a nitride, e.g., silicon nitride, and the tunnel insulation layer 144 may be formed of an oxide, e.g., silicon oxide. A structure including the blocking layer 140, the charge storage layer 142 and the tunnel insulation layer 144 may serve as a data storage layer.

In some embodiments, the first channel layer 146 may be formed of, e.g., doped polysilicon or undoped polysilicon.

In some embodiments, a preliminary first channel layer (not shown) may be formed on the tunnel insulation layer 114. A surface of the preliminary first channel layer may be partially etched by a trimming process to form a first channel layer 146 having a target thickness. In some embodiments, the first channel layer 146 having the target thickness may be formed on the tunnel insulation layer without the trimming process.

Figure 5:
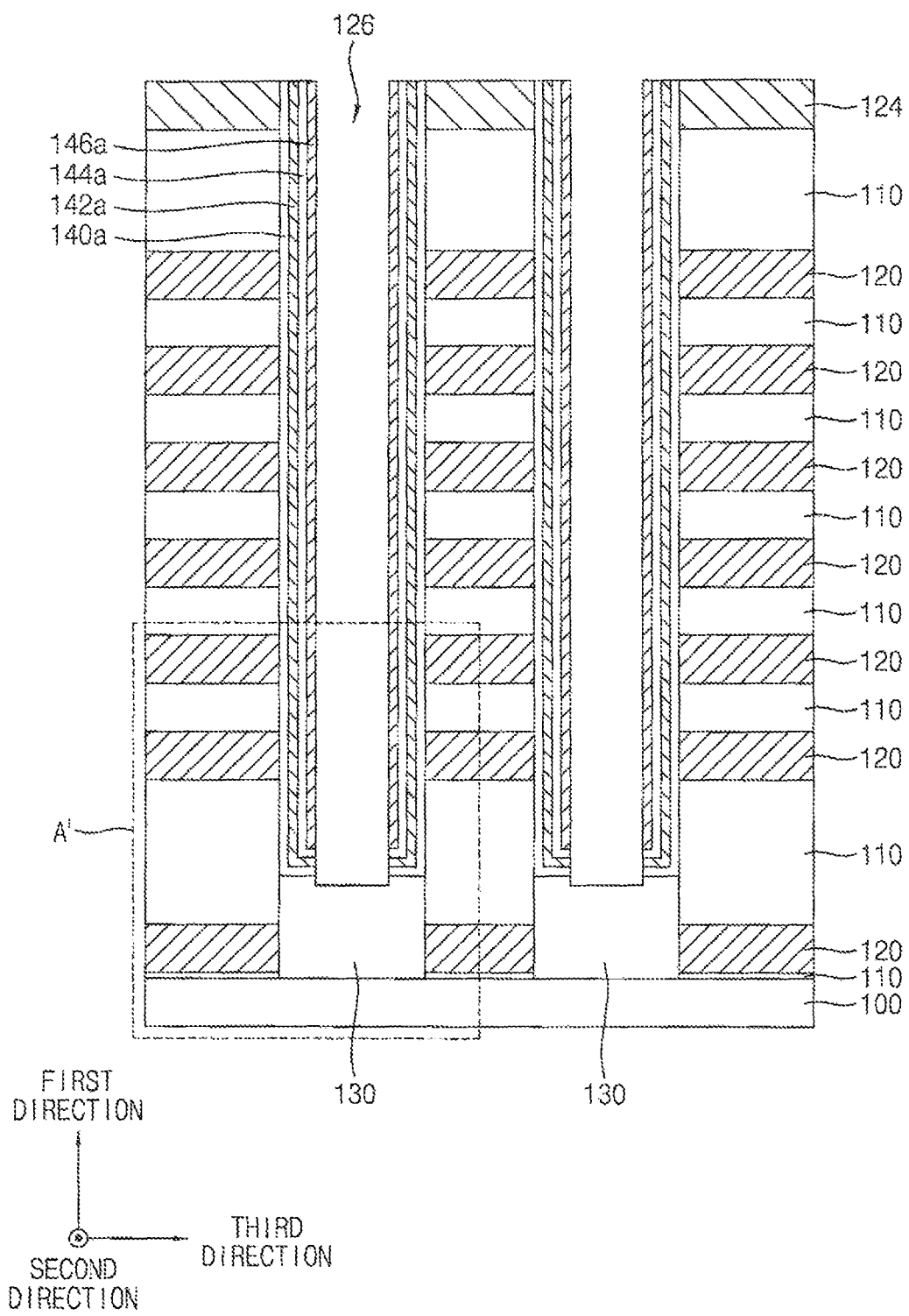
Figure 6:
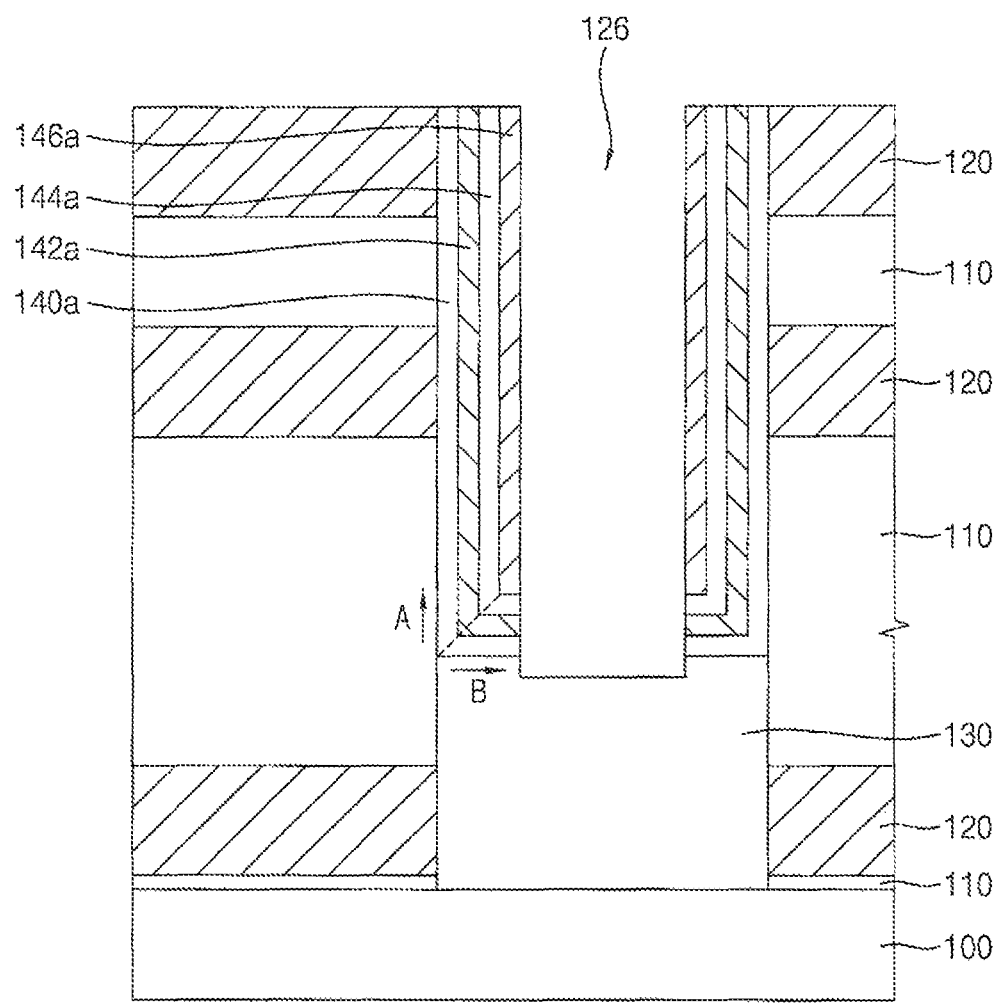

FIG. 6 is an enlarged view of a portion "A" of FIG. 5.

Referring to FIGS. 5 and 6, the first channel layer 146, the tunnel insulation layer 144, the charge storage layer 142 and the blocking layer 140 may be anisotropically etched to expose the upper surface of the semiconductor pattern 130. During the etching process, portions of the first channel layer 146, the tunnel insulation layer 144, the charge storage layer 142 and the blocking layer 140 on the hard mask 124 may be removed, so that a first blocking pattern 140a, a charge storage pattern 142a, a tunnel insulation pattern 144a and a first channel pattern 146a may be sequentially formed on the sidewall of the hole 126.

As shown in FIGS. 5 and 6, the upper surface of the semiconductor pattern 130 may be exposed by the hole 126. In some embodiments, the upper surface of the semiconductor pattern 130 may be partially etched, so that a recess may be formed at a central upper surface of the semiconductor pattern 130.

Each of the first blocking pattern 140a, the charge storage pattern 142a and the tunnel insulation pattern 144a may have a first portion A and a second portion B. The first portions A may be disposed on the sidewall of the hole 126, and may extend in the first direction. The second portions B may be disposed below a bottom of the first channel pattern 146a, and may extend in a direction substantially parallel to the upper surface of the semiconductor pattern 130. The second portions B may be partially exposed by a lower sidewall of the hole 126.

The first channel pattern 146a may extend in the first direction. That is, the first channel pattern 146a may not have a portion extending in the direction substantially parallel to the upper surface of the semiconductor pattern 130. A sidewall of the first channel pattern 146a may be exposed by the hole 126.

Figure 7:
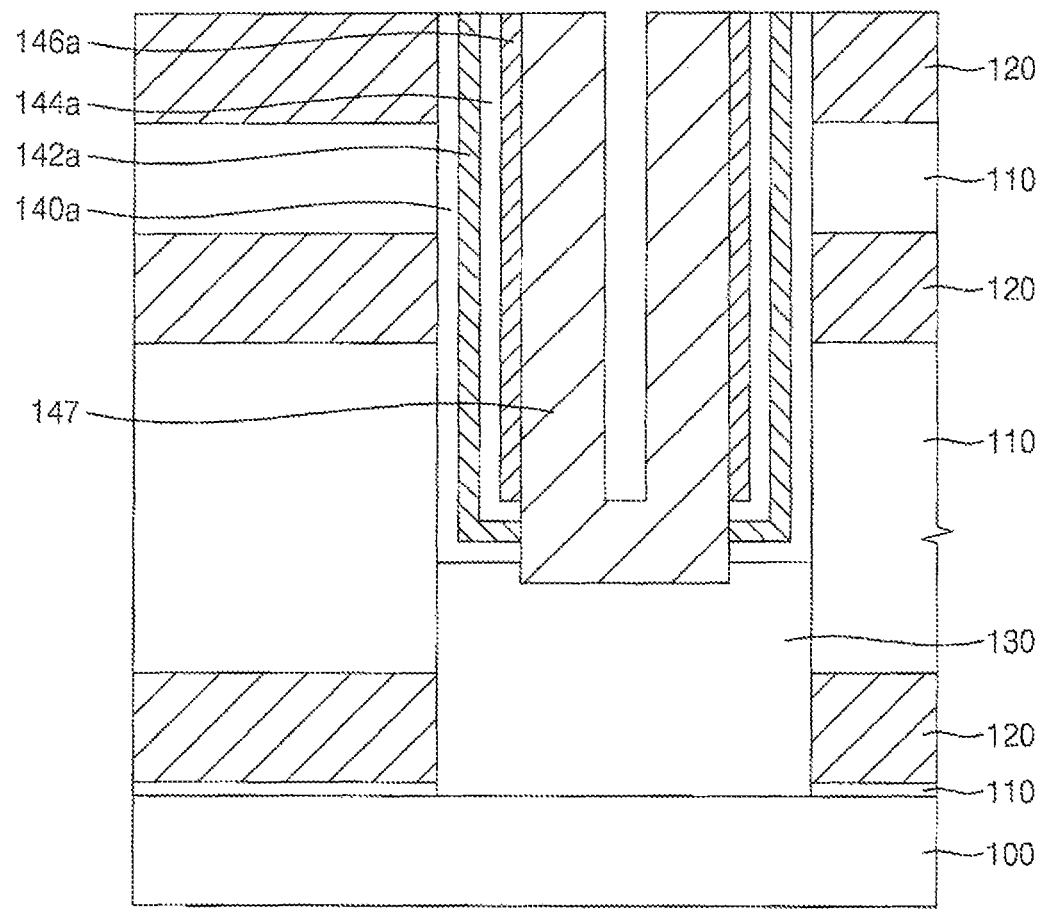

Referring to FIG. 7, a preliminary second channel layer 147 may be conformally formed on the second portions B of the first blocking pattern 140a, the charge storage pattern 142a and the tunnel insulation pattern 144a, the first channel pattern 146a, the semiconductor pattern 130 and the hard mask 124. The preliminary second channel layer 147 may be crystallized by an annealing process.

In some embodiments, the preliminary second channel layer 147 may be formed of, e.g., doped or undoped polysilicon. The preliminary second channel layer 147 may include a material substantially the same as a material of the first channel pattern 146a.

Figure 8:
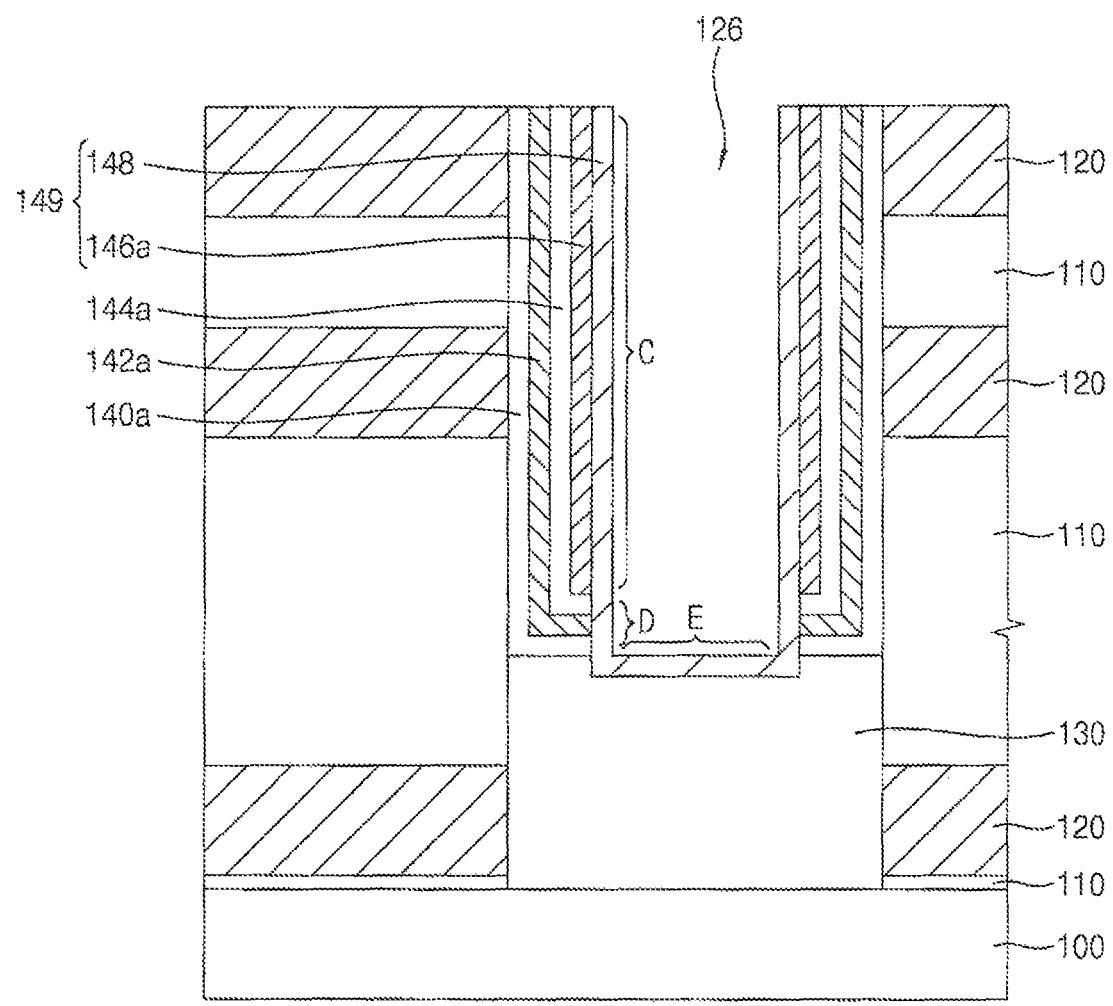

Referring to FIG. 8, a surface of the preliminary second channel layer 147 may be partially etched by a trimming process to form a second channel layer 148 having a target thickness.

In some embodiments, the second channel layer 148 having a target thickness may be formed on the second portions B, the first channel pattern 146a, the semiconductor pattern 130 and the hard mask 124 without performing the trimming process, and the second channel layer 148 may be crystallized by an annealing process.

After subsequent processes, the first channel pattern 146a and the second channel layer 148 may serve as a portion of a channel region in the memory cell, and may be electrically connected to the semiconductor pattern 130. A merged layer of the first channel pattern 146a and the second channel layer 148 may be referred to as a third channel layer 149.

The third channel layer 149 on the first portion A of the tunnel insulation pattern 144a may include the first channel pattern 146a and the second channel layer 148 sequentially stacked. The third channel layer 149 on the second portions B of the first blocking pattern 140a, the charge storage pattern 142a and the tunnel insulation pattern 144a and the semiconductor pattern 130 may only include the second channel layer 148.

Thus, a portion of the third channel layer 149 on the second portions B of the first blocking pattern 140a, the charge storage pattern 142a and the tunnel insulation pattern 144a and the semiconductor pattern 130 may have a thickness less than a thickness of a portion of the third channel layer 149 on the first portion A of the tunnel insulation pattern 144a.

The third channel layer 149 may include a third portion C, a fourth portion D and a fifth portion E. The third portion C may be positioned on the first portion A of the tunnel insulation pattern 144a. The fourth portion D may be positioned on the second portions B of the first blocking pattern 140a, the charge storage pattern 142a and the tunnel insulation pattern 144a, and the fifth portion E may be positioned on the semiconductor pattern 130.

In the third channel layer 149, the fourth portion D may be disposed between the third portion C and the fifth portion E. That is, the third portion C of the third channel pattern 149 and the semiconductor pattern 130 may be connected by the fourth portion D of the third channel pattern 149. However, in the third channel layer 149, a thickness of the fourth portion D may be less than a thickness of the third portion C, so that a channel resistance of the third channel layer 149 due to the fourth portion D may increase.

Figure 9:
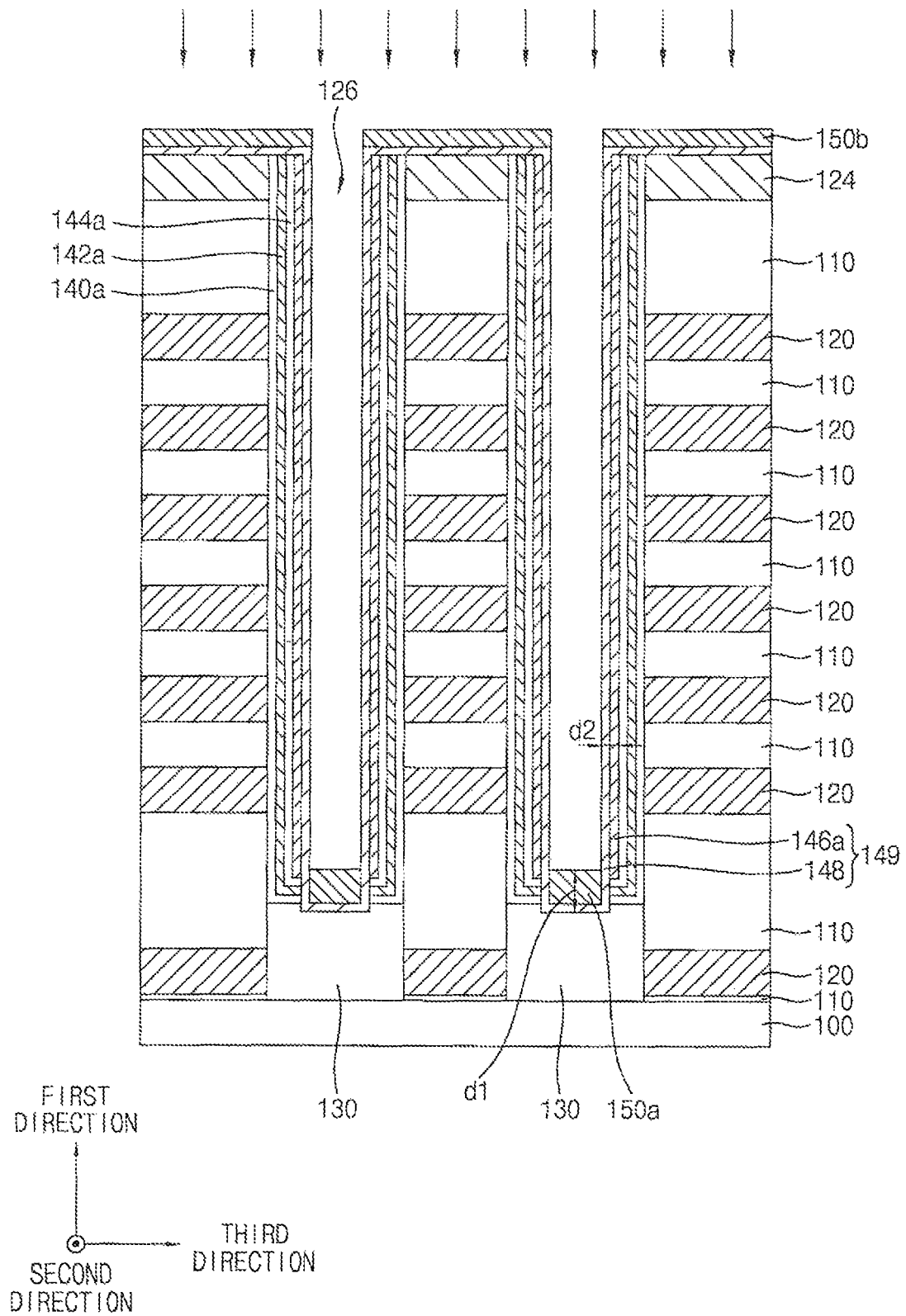
Figure 10:
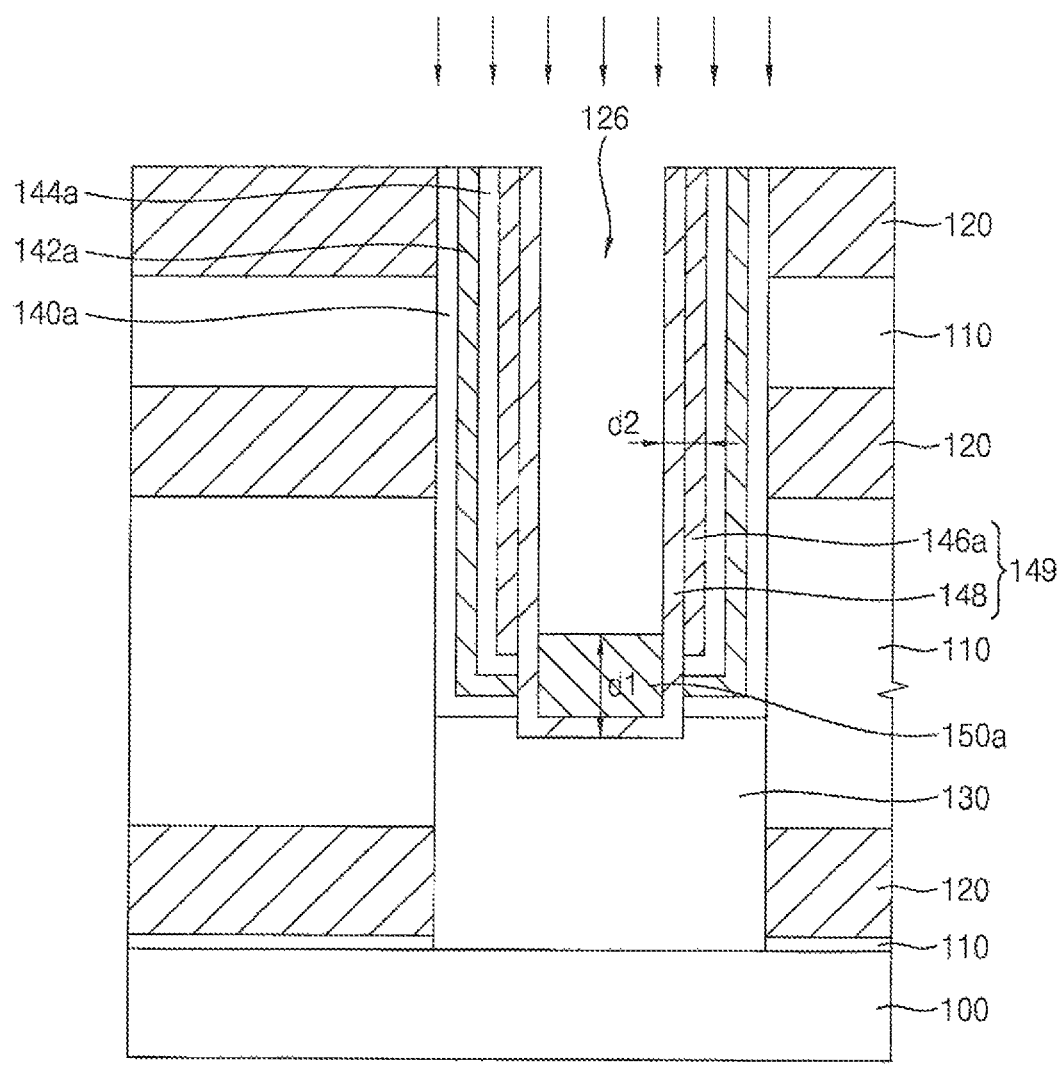

Referring to FIGS. 9 and 10, impurities including silicon may be implanted onto the second channel layer 148 in the first direction to form a silicon pattern 150a on a portion of the second channel layer 148 on the semiconductor pattern 130. For example, the impurities including silicon may include silicon ions. The silicon pattern 150 may be formed on the fourth portion D and the fifth portion E of the second channel layer 148 shown in FIG. 8.

When the ions including silicon are implanted in the first direction, the silicon pattern 150a may not be substantially formed on the third portion C of the second channel layer 148. In some embodiments, in a silicon doping process, an implant dose may be about $1.0E14/cm^2$ to about $1.0E17/cm^2$, and an implant energy may be about 1 keV to about 10 keV. In some embodiments, an amorphous silicon pattern may be formed on the second channel layer 148 by the silicon doping process, and the amorphous silicon pattern may be crystallized to form the crystalline silicon pattern 150a by a subsequent annealing processes.

The silicon pattern 150a may be formed to completely cover the second portions B of the first blocking pattern 140a, the charge storage pattern 142a and the tunnel insulation pattern 144a. That is, an upper surface of the silicon pattern 150a may be higher than a lower surface of the first channel pattern 146a.

The third channel layer 149 and the silicon pattern 150a may be referred to as a preliminary channel structure serving as a channel region of the memory cell. The preliminary channel structure may be electrically connected to the semiconductor pattern 130.

The preliminary channel structure may further include the silicon pattern 150a, so that a thickness of layers serving as a channel region of the memory cell on the semiconductor pattern 130 may be increased.

As shown in FIG. 9, the impurities including silicon may be also implanted onto a portion of the second channel layer 148 on the hard mask 124, so that an upper silicon pattern 150b may be formed on the second channel layer 148.

Figure 11:
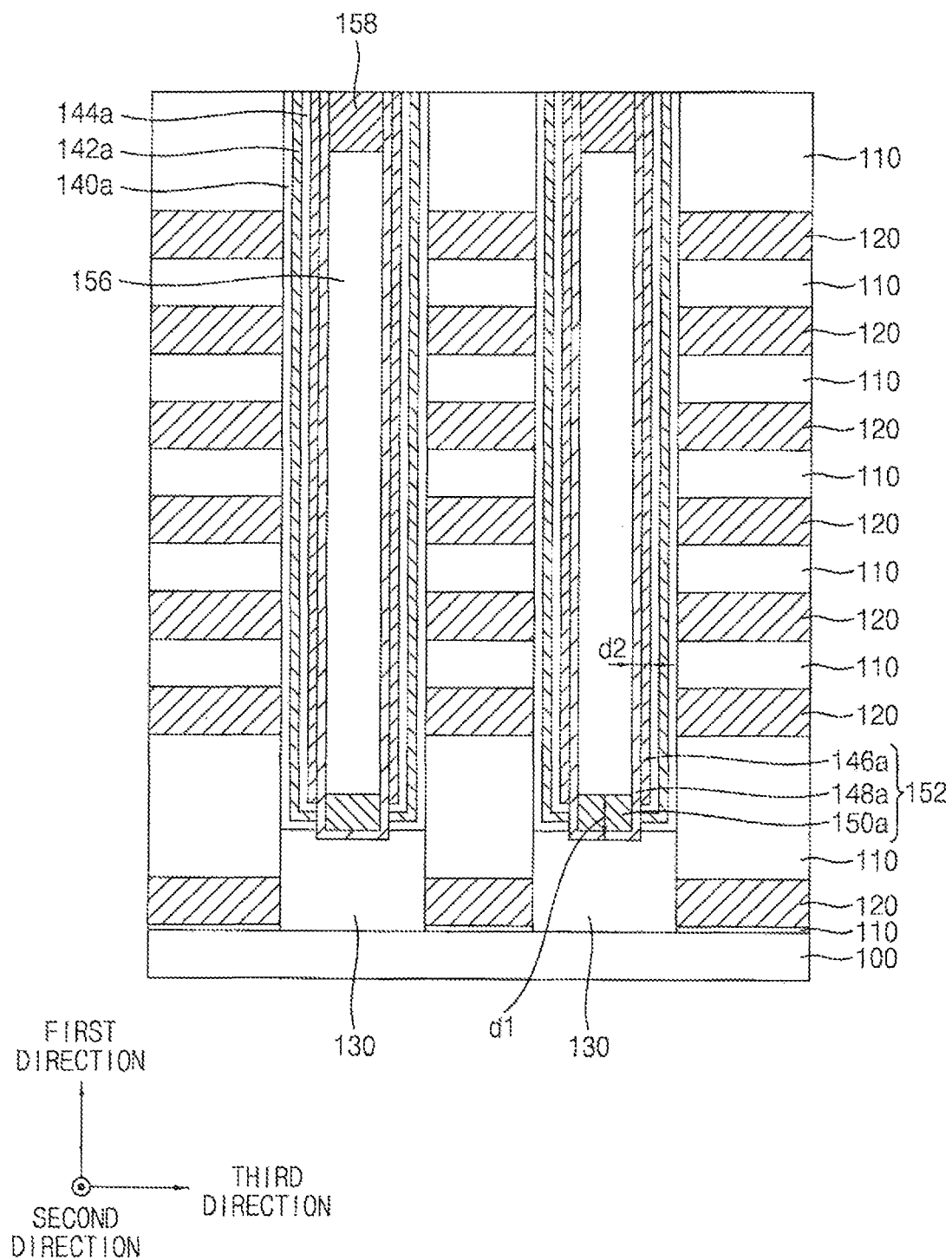
Figure 12:
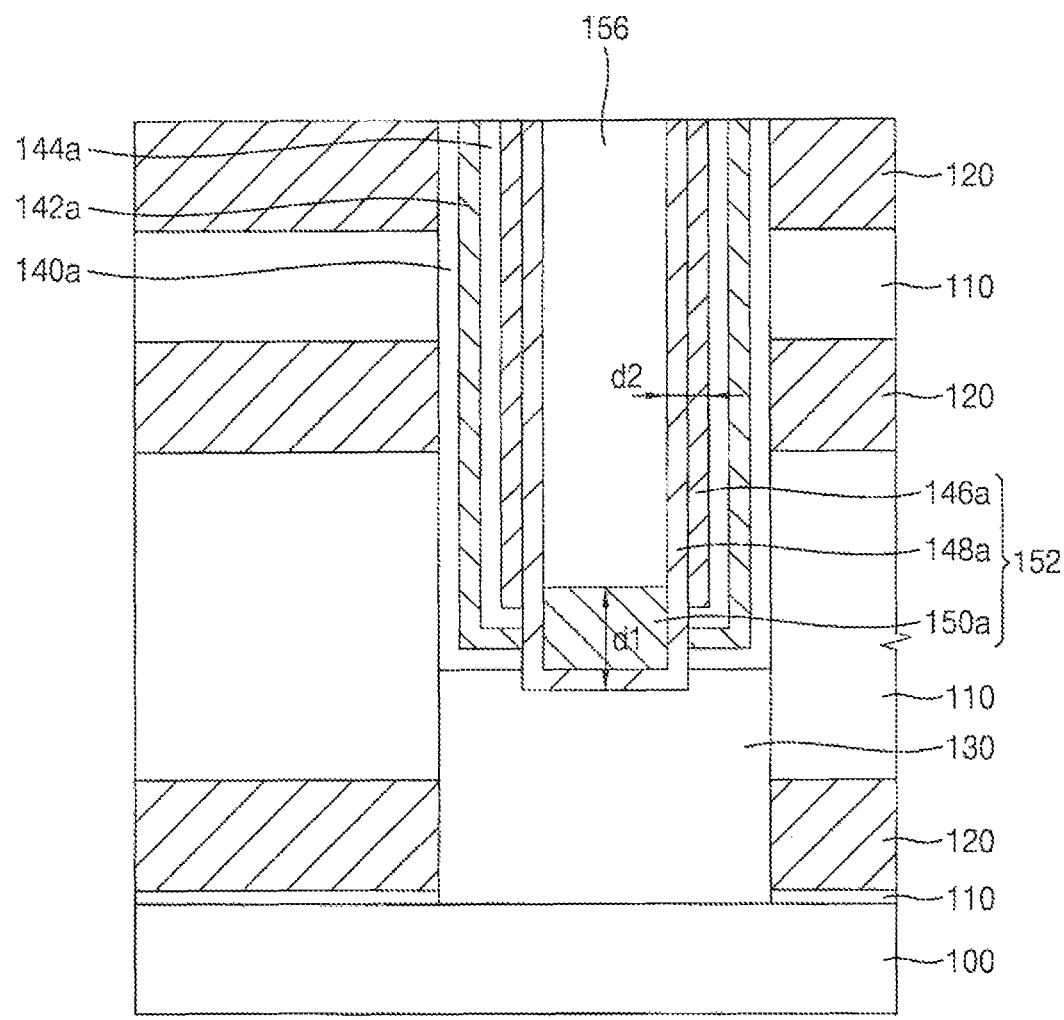

Referring to FIGS. 11 and 12, a second insulation layer may be formed on the preliminary channel structure to fill a remaining portion of the hole 126. The second insulation layer, the tunnel insulation pattern 144a, the charge storage pattern 142a, the first blocking pattern 140a, the preliminary channel structure and the hard mask 124 may be planarized until an upper surface of the first insulation layer 110 may be exposed to form a filling insulation pattern 156 in the hole 126. The planarization process may include an etch back process or a chemical mechanical polishing (CMP) process. The hard mask 124, a portion of the second channel layer 148 on the hard mask 124 and the upper silicon pattern 150b may be removed by the planarization process, so that a channel structure 152 may be formed.

The filling insulation pattern 156 in an upper portion of the hole 126 may be partially etched to form a recess. A pad layer may be formed to fill the recess, and may be planarized to form a pad 158. In some embodiments, the pad 158 may be formed of, e.g., doped polysilicon.

The channel structure 152 may include the first channel pattern 146a, the second channel pattern 148a and the silicon pattern 150a. In some embodiments, the silicon pattern 150a may be formed on a portion of the second channel pattern 148a on the semiconductor pattern 130.

The second channel pattern 148a and the silicon pattern 150a may serve as an upper channel pattern. An upper surface of the upper channel pattern may be higher than a lower surface of the first channel pattern 146a.

A portion of the channel structure 152 on the semiconductor pattern 130 may include the second channel pattern 148a and the silicon pattern 150a sequentially stacked, and may have a first thickness d1 in the first direction from the upper surface of the semiconductor pattern 130. A portion of the channel structure 152 on the tunnel insulation pattern 144a may include the first and second channel patterns 146a and 148a sequentially stacked, and may have a second thickness d2 in the third direction. The first thickness d1 may be substantially the same as or greater than the second thickness d2. Thus, the semiconductor pattern 130 and the channel structure 152 may not be disconnected from each other, or a channel resistance between the semiconductor pattern 130 and the channel structure 152 may not increase.

Figure 13:
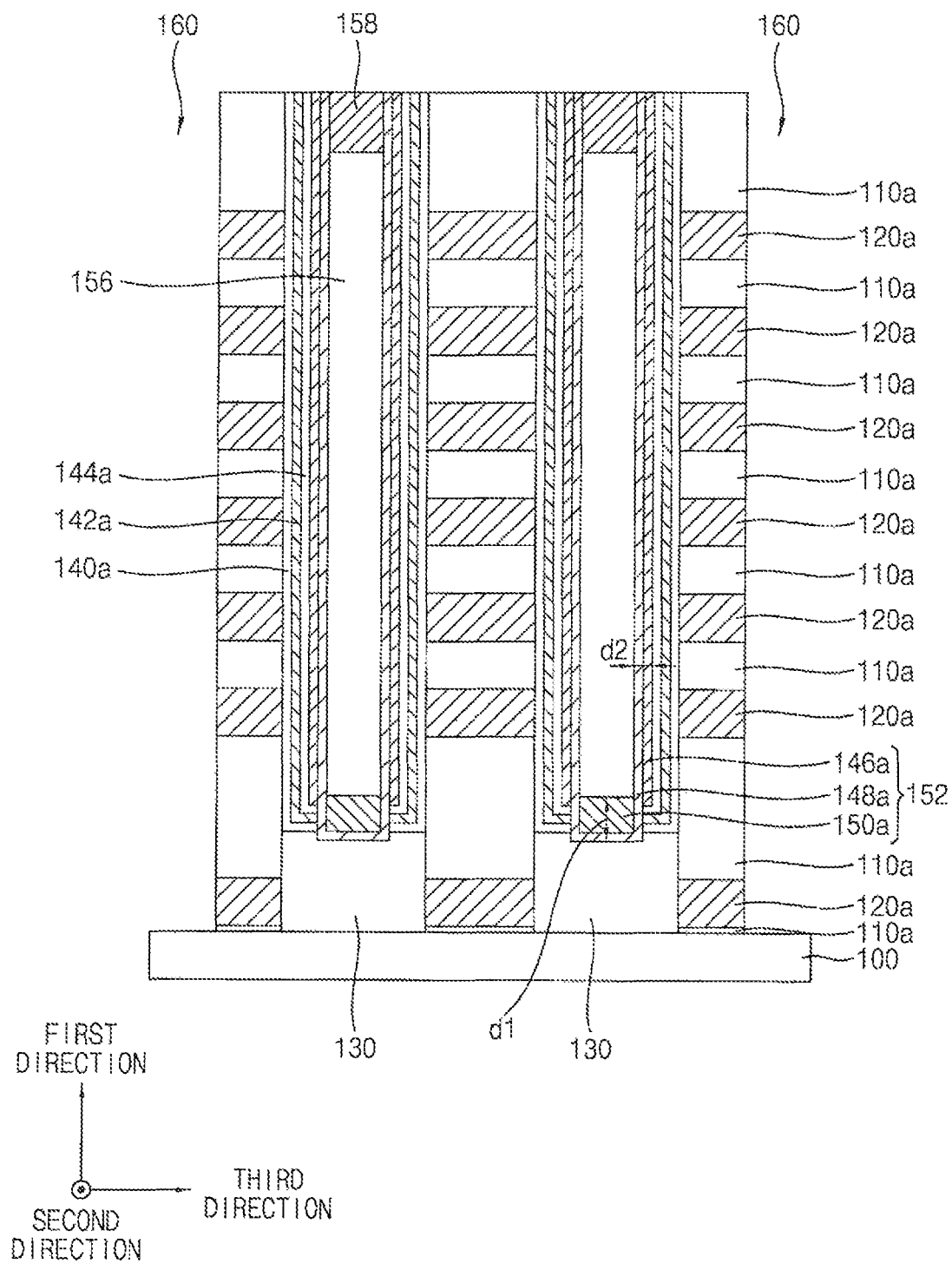

Referring to FIG. 13, a first opening 160 may be formed through the mold structure 113 to expose an upper surface of the substrate 100.

In some embodiments, a hard mask (not shown) may be formed on the uppermost one of the first insulation layers 110 and the pad 158, and the mold structure 113 may be anisotropically etched using the hard mask as an etching mask to form the first opening 160.

In some embodiments, the first opening 160 may extend in the second direction, and a plurality of first openings 160 may be formed in the third direction. Thus, a first sacrificial pattern 120a and a first insulation pattern 110a may be formed from the first sacrificial layer 120 and the first insulation layer 110, respectively.

Figure 14:
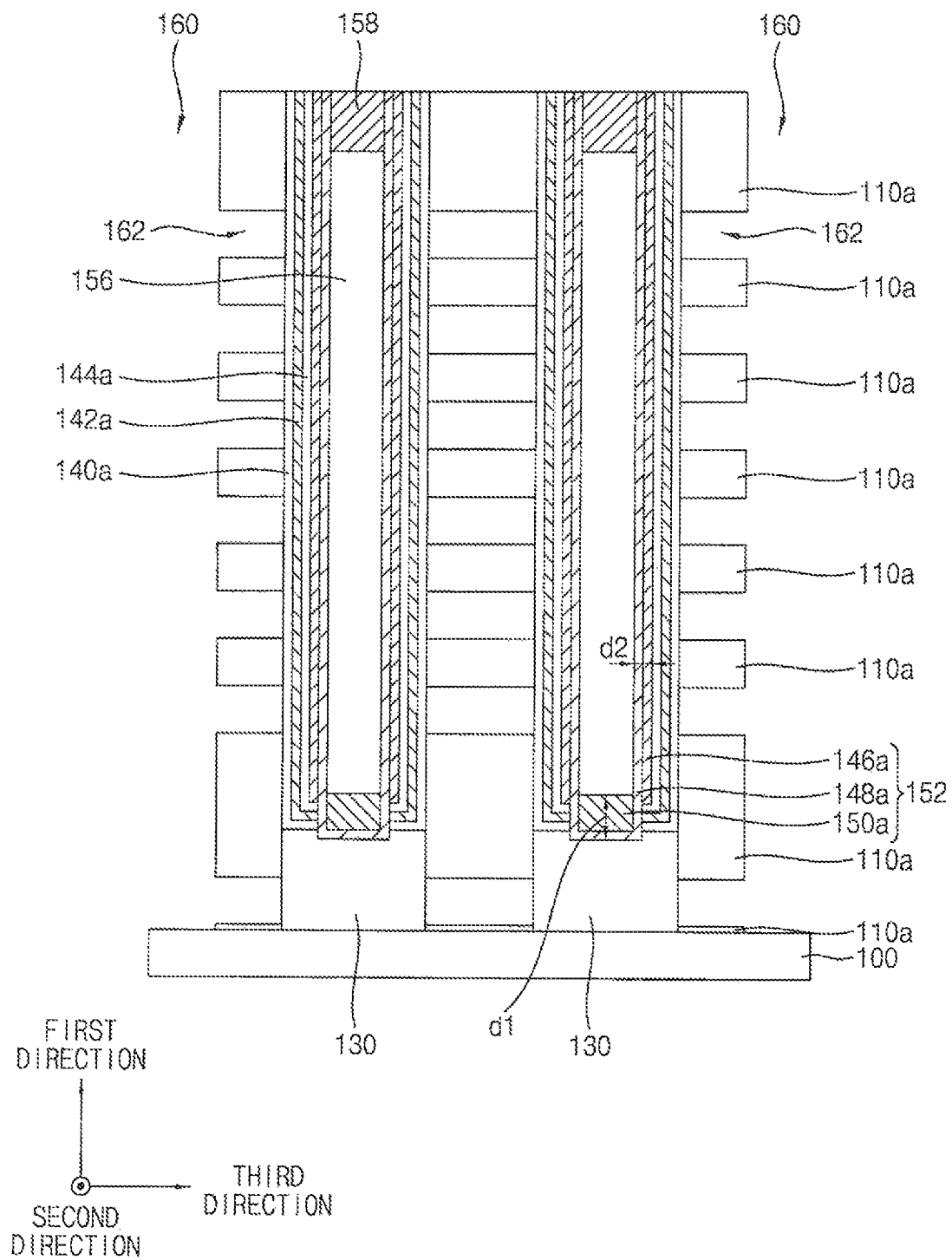

Referring to FIG. 14, the first sacrificial pattern 120a exposed by a sidewall of the first opening 160 may be selectively etched to form a gap 162 between the first insulation patterns 110a. Sidewalls of the first blocking pattern 140a and the semiconductor pattern 130 may be partially exposed by the gap 162.

The first sacrificial pattern 120a may be removed by an isotropic etching process, e.g., a wet etching process, an isotropic dry etching process, etc. In some embodiments, the first sacrificial pattern 120a may be etched using an etchant including phosphoric acid or sulfuric acid.

Figure 15:
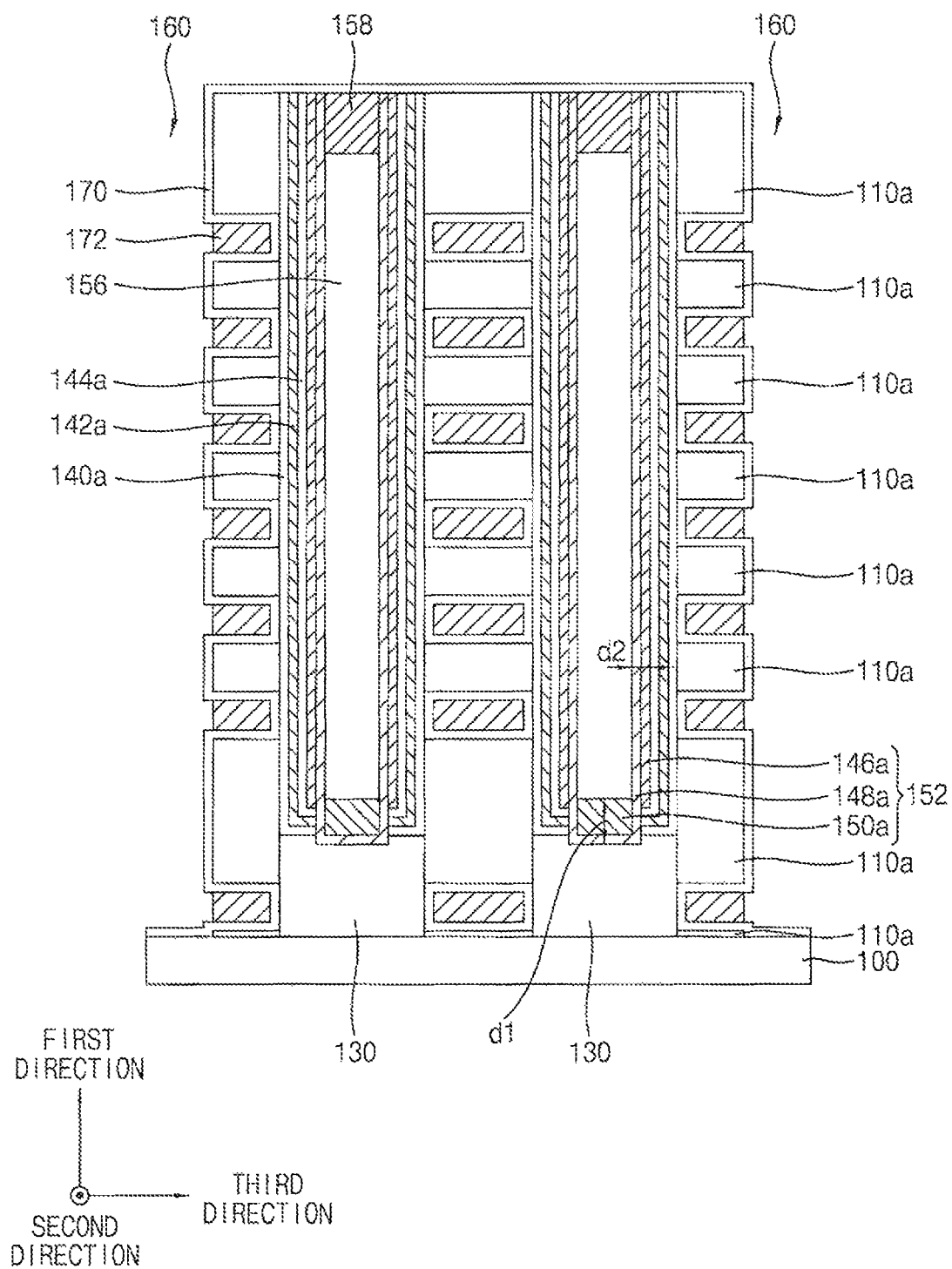

Referring to FIG. 15, a second blocking layer 170 may be conformally formed on the sidewalls of the first blocking pattern 140a and the sidewall of the semiconductor pattern 130, an inner wall of the gap 162, the first insulation pattern 110a, the pad 158 and the substrate 100. A first gate 172a and second gates 172b may be formed on the second blocking layer 170 to fill the gaps 162, respectively.

In some embodiments, the second blocking layer 170 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

In order to form the first and second gates 172a and 172b, a gate electrode layer may be formed on the second blocking layer 170 to fill the gap 162. The gate electrode layer may be formed of a metal and/or a metal nitride. In some embodiments, the gate electrode layer may be formed of a metal having a low electric resistance, e.g., tungsten, titanium, tantalum, platinum, etc., and a metal nitride, e.g., titanium nitride, tantalum nitride, etc. The gate electrode layer may be partially etched to form the first and second gates 172a and 172b in the gaps 162, respectively. In some embodiments, the first electrode layer may be partially etched by a wet etching process.

That is, the first gate 172a may be formed on the sidewall of the semiconductor pattern 130, and may serve as a GSL. The second gates 172b may be formed on the sidewall of the channel structure 152, and may serve as word lines or a SSL.

Figure 16:
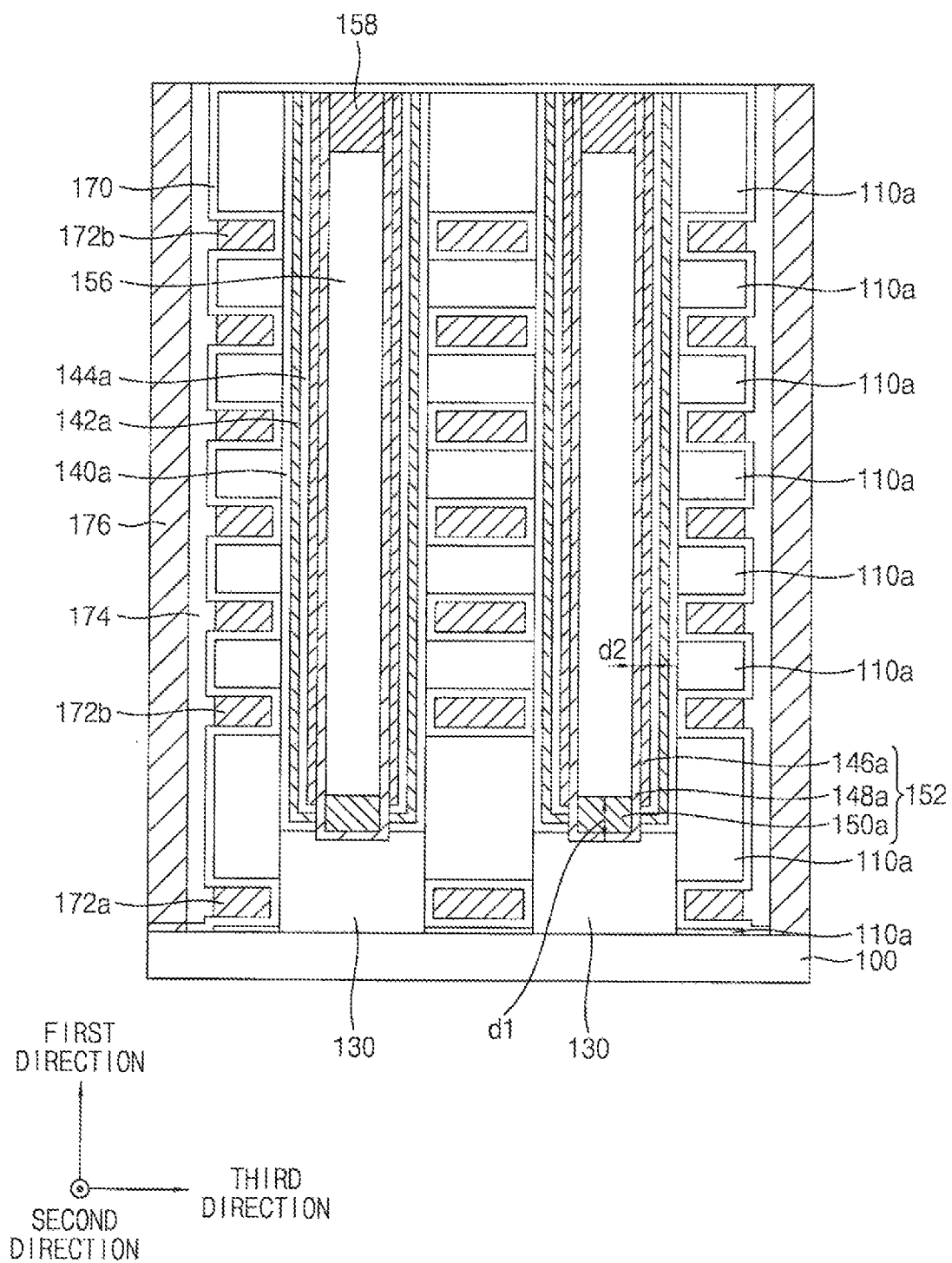

Referring to FIG. 16, a third insulation layer may be conformally formed on the second blocking layer 170 along a bottom and the sidewall of the first opening 160. The third insulation layer may be anisotropically etched to form a second insulation pattern 174 on the sidewall of the first opening 160 to expose the upper surface of the substrate 100. Also, the first opening 160 may be transformed to a second opening (not shown) by the second insulation pattern 174. Impurities may be doped into a portion of the substrate 100 exposed by the second opening, so that an impurity region (not shown) may be formed. A conductive pattern 176 may be formed to fill the second opening. The conductive pattern 176 may serve as a CSL.

In particular, a conductive layer may be formed to fill the second opening, and may be planarized until an upper surface of the second blocking layer 170 may be exposed to form the conductive pattern 176. The conductive layer may be formed of a metal and/or a metal nitride. In some embodiments, the conductive layer may include a metal having a low resistance, e.g., tungsten, titanium, tantalum, platinum, etc., and/or a metal nitride, e.g., titanium nitride, tantalum nitride, etc.

A bit line contact (not shown) and a bit line (not shown) may be formed on the pad 158, and may be electrically connected to the pad 158. Thus, the vertical semiconductor device may be manufactured.

As described above, the channel structure 152 may have the first thickness in the first direction from the semiconductor pattern 130, and may have the second thickness in the third direction from the tunnel insulation pattern 144a. The first thickness of the channel structure 152 may be greater than the second thickness of the channel structure 152. Thus, the semiconductor pattern 130 and the channel structure 152 may not be disconnected from each other, or a channel resistance between the semiconductor pattern 130 and the channel structure 152 may not increase.

Figure 17:
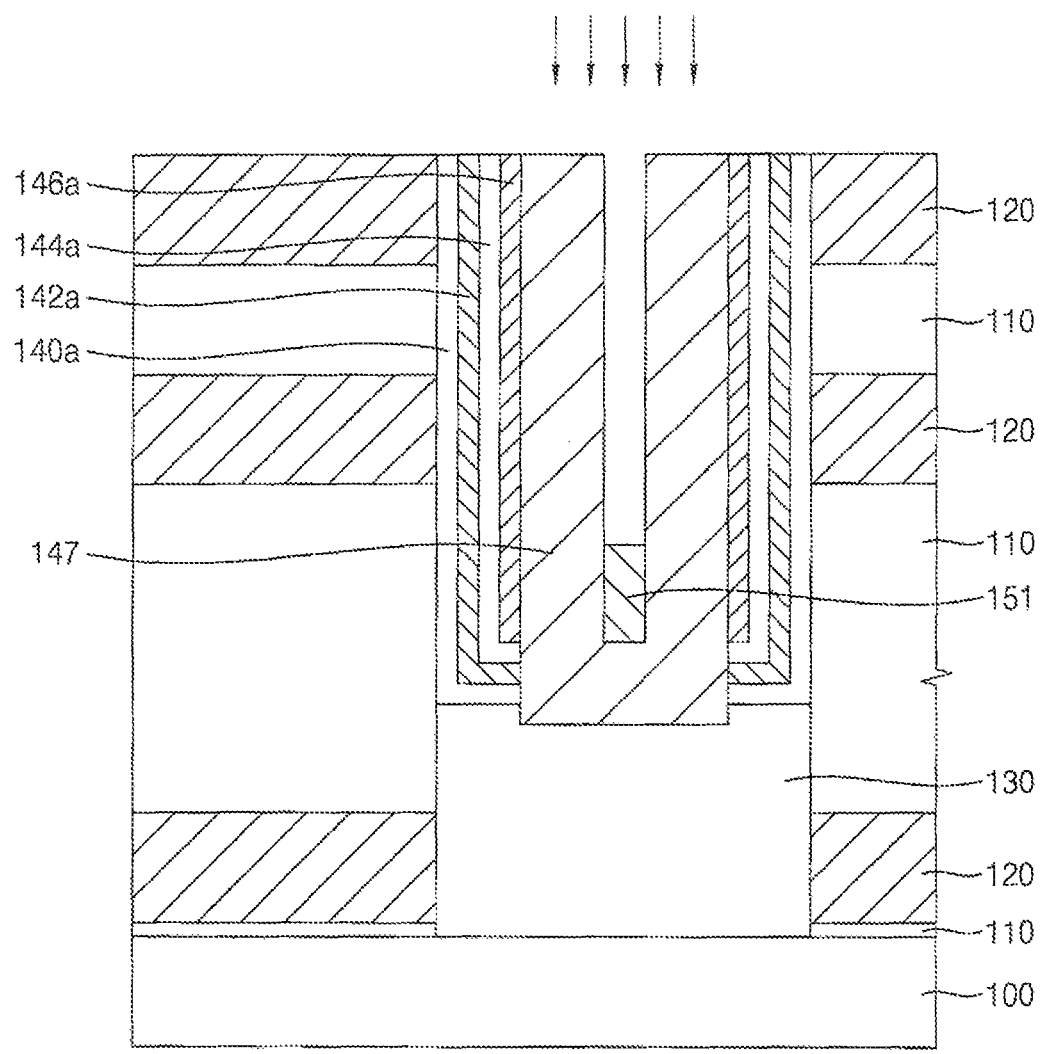
Figure 18:
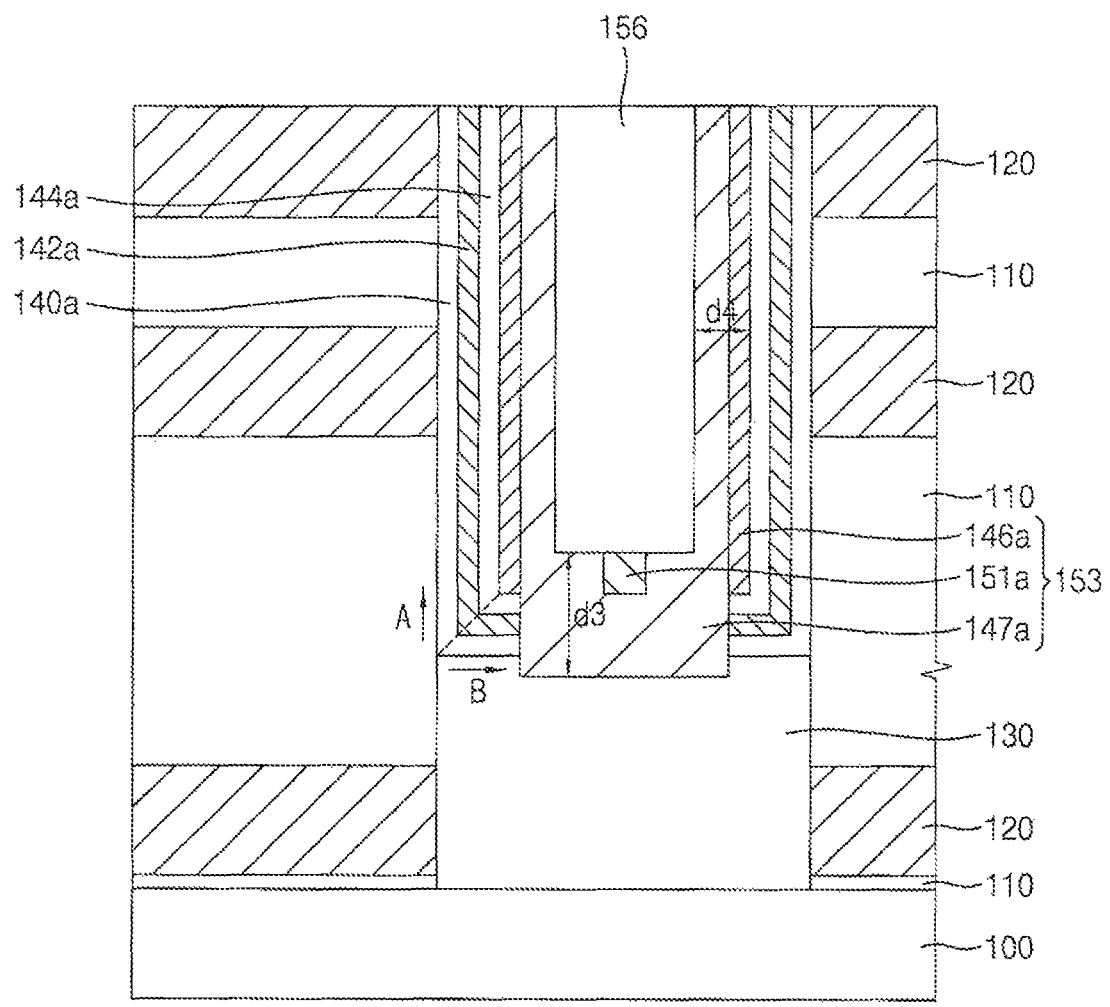
Figure 19:
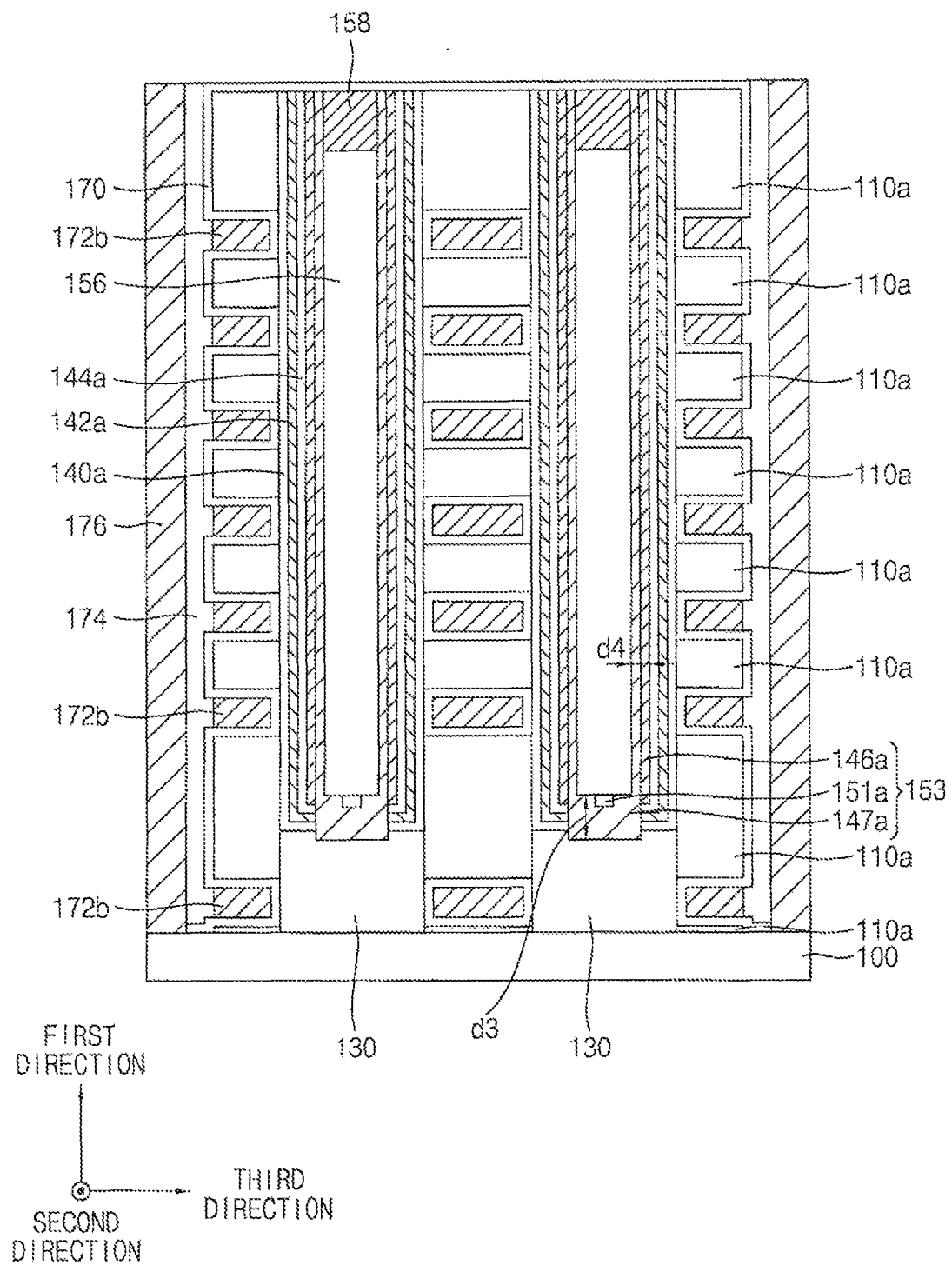

FIGS. 17 to 19 are cross-sectional views illustrating stages of methods of manufacturing a semiconductor device in accordance with some embodiments. FIGS. 17 and 18 are enlarged views of a portion of the vertical semiconductor device.

The vertical semiconductor device may be manufactured by processes substantially the same as or similar to processes illustrated with reference to FIGS. 2 and 16.

First, processes substantially the same as or similar to the processes illustrated with reference to FIGS. 2 and 7 may be performed. Thus, the preliminary second channel layer 147 may be conformally formed on the first channel pattern 146a, the second portions of the first blocking pattern 140a, the charge storage pattern 142a and the tunnel insulation pattern 144a, the semiconductor pattern 130 and the hard mask 124.

Referring to FIG. 17, impurities including silicon may be implanted to the preliminary second channel layer 147 in the first direction to form a preliminary silicon pattern 151 on a portion of the preliminary second channel layer 147 on the semiconductor pattern 130.

In some embodiments, in a silicon doping process, an implant dose may be about $1.0E14/cm^2$ to about $1.0E17/cm^2$. In some embodiments, an amorphous silicon pattern may be formed by the silicon doping process, and the amorphous silicon pattern may be crystallized by a subsequent annealing processes to form the preliminary silicon pattern 151.

Thus, the preliminary second channel layer 147 and the preliminary silicon pattern 151 may be formed on the semiconductor pattern 130. The preliminary second channel layer 151 may be formed on a sidewall of the first channel pattern 146a. That is, a thickness of a portion of layers on the semiconductor pattern 130 may be greater than a thickness of a portion of the layers on the first channel pattern 146a.

Referring to FIG. 18, surfaces of the preliminary second channel layer 147 and the preliminary silicon pattern 151 may be partially etched by a trimming process to form a second channel layer having a target thickness.

In the trimming process, the surfaces of the preliminary second channel layer 147 and the preliminary silicon pattern 151 may be first etched, so that a portion of the preliminary second channel layer 147 under the preliminary silicon pattern 151 may be hardly etched. Thus, a portion of the second channel layer on the semiconductor pattern 130 may have a thickness substantially the same as a thickness of the preliminary second channel layer 147.

In some embodiments, after the trimming process, a portion of the preliminary silicon pattern 151 may remain on the second channel layer to form a silicon pattern 151*a*. In some embodiments, during the trimming process, the preliminary silicon pattern 151 may be completely removed, so that no silicon pattern may be formed.

A portion of the second channel layer on the upper surface of the semiconductor pattern 130 may cover the second portions B of the first blocking pattern 140*a*, the charge storage pattern 142*a* and the tunnel insulation pattern 144*a*.

Then, processes may be substantially the same as or similar to the processes illustrated with reference to FIG. 11 may be performed. Thus, the channel structure 153 and the filling insulation pattern 156 may be formed in the hole 126.

In some embodiments, the channel structure 153 may include a first channel pattern 146*a*, a second channel pattern 147*a* and a silicon pattern 151*a*.

In some embodiments, a portion of the channel structure 153 on the semiconductor pattern 130 may include the second channel pattern 147*a* and the silicon pattern 151*a* sequentially stacked, and may have a third thickness d3 in the first direction from the upper surface of the semiconductor pattern 130. A portion of the channel structure 153 on the tunnel insulation pattern 144*a* may include the first and second channel patterns 146*a* and 147*a* sequentially stacked, and may have a fourth thickness d4 in the third direction. The third thickness d3 may be substantially the same as or greater than the fourth thickness d4.

The second channel pattern 147*a* and the silicon pattern 151*a* may serve as an upper channel pattern. An upper surface of the upper channel pattern on the semiconductor pattern may be higher than a lower surface of the first channel pattern 146*a*.

Then, processes may be substantially the same as or similar to the processes illustrated with reference to FIGS. 12 and 16 may be performed, so that the vertical semiconductor device shown in FIG. 19 may be manufactured.

Figure 20:
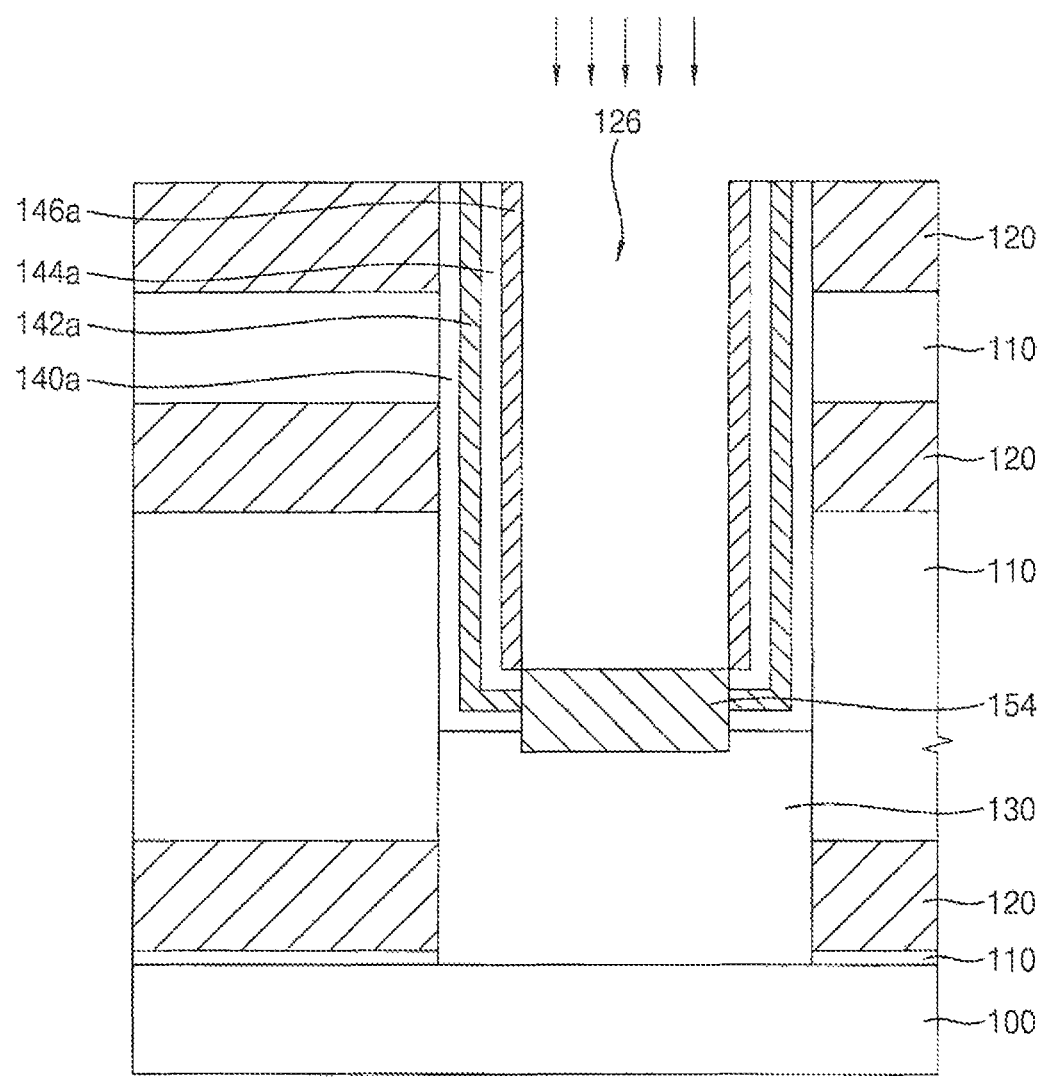
Figure 21:
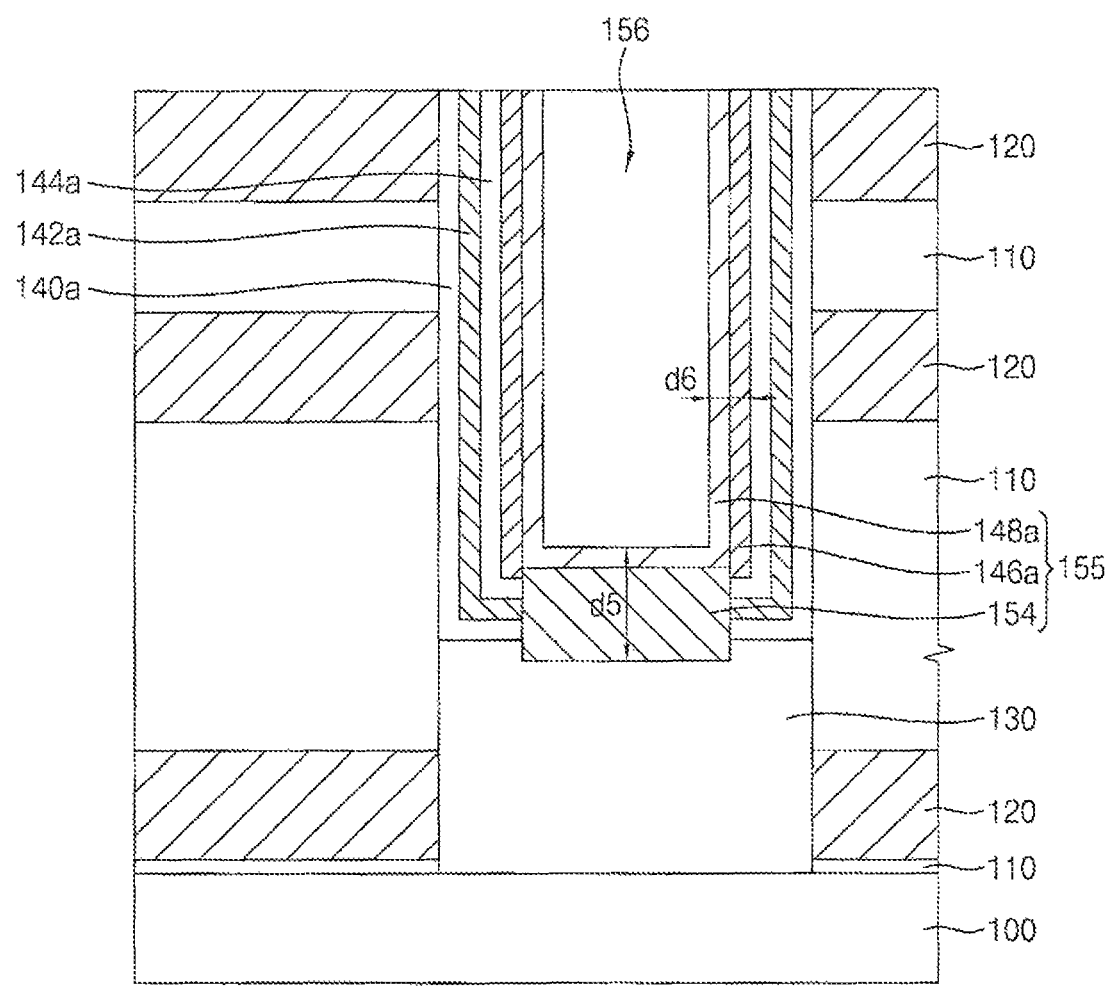
Figure 22:
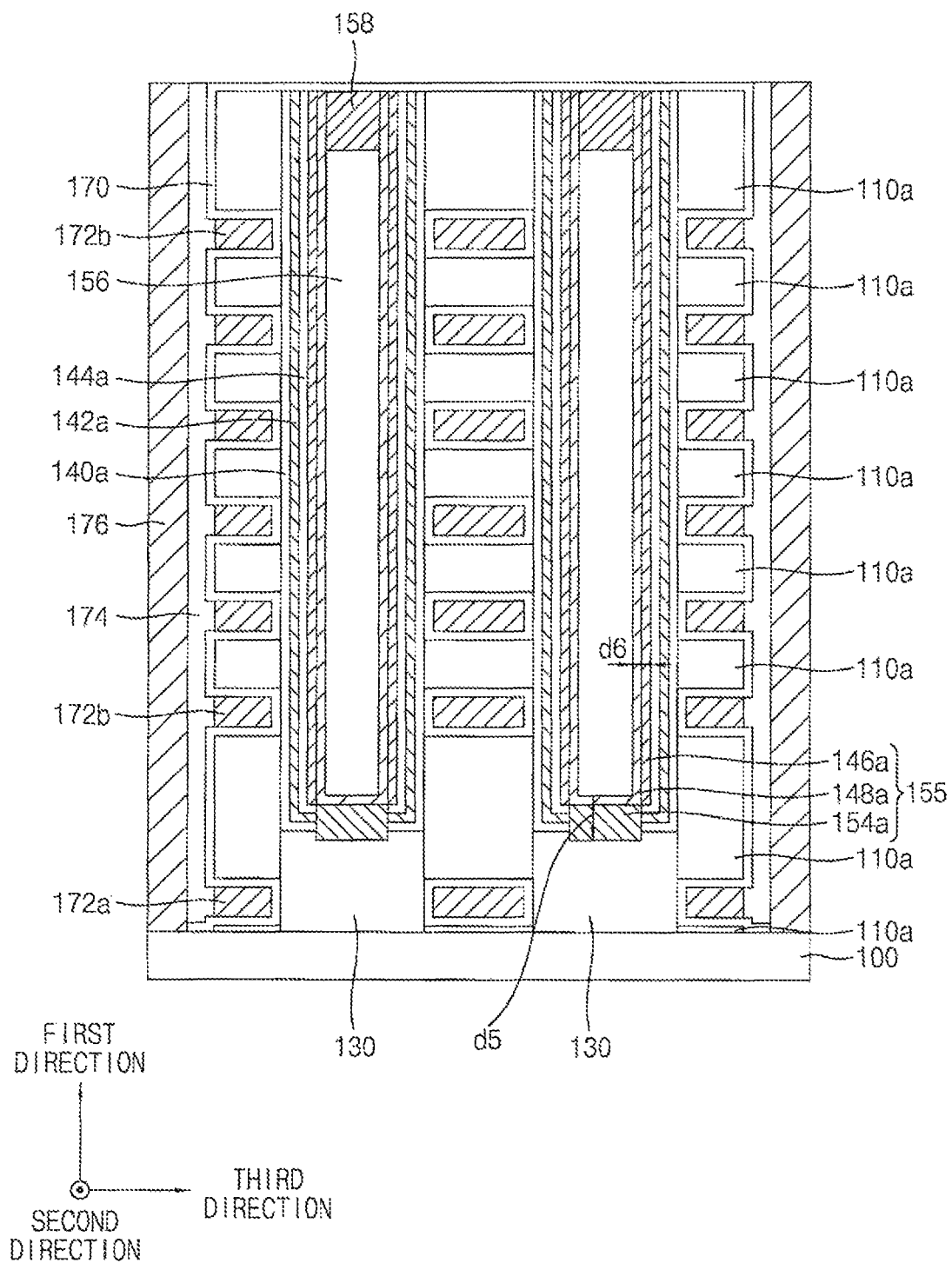

FIGS. 20 to 22 are cross-sectional views illustrating stages of a method of manufacturing a vertical semiconductor device in accordance with some embodiments. FIGS. 20 and 21 are enlarged views of a portion of the vertical semiconductor device.

The vertical semiconductor device may be manufactured by processes substantially the same as or similar to processes illustrated with reference to FIGS. 2 and 16.

First, processes may be substantially the same as or similar to the processes illustrated with reference to FIGS. 2 and 6 may be performed. Thus, the first blocking pattern 140*a*, the charge storage pattern 142*a*, the tunnel insulation pattern 144*a* and the first channel pattern 146*a* may be formed on a sidewall of the hole 126. An upper surface of the semiconductor pattern 130 may be exposed by the hole 126.

Referring to FIG. 20, a silicon pattern 154 may be formed on the exposed upper surface of the semiconductor pattern 130.

In some embodiments, impurities including silicon may be implanted to the semiconductor pattern 130 in the first direction to form the silicon pattern 154. The impurities may not be doped into the first channel pattern 146*a*, so that the silicon pattern 154 may be formed on the semiconductor pattern 130. The silicon pattern 154 may include, e.g., amorphous silicon or crystalline silicon.

In some embodiments, the silicon pattern 154 may be formed by a selective epitaxial growth (SEG) process using the exposed the upper surface of the semiconductor pattern 130 as a seed. In this case, the silicon pattern 154 may include, e.g., crystalline silicon.

Referring to FIG. 21, a second channel layer may be formed on the sidewall and a bottom of the hole 126 to cover the silicon pattern 154 and the first channel pattern 146*a*.

In some embodiments, a preliminary second channel layer may be formed on the sidewall and the bottom of the hole 126. A surface of the preliminary second channel layer may be partially etched by a trimming process to form a second channel layer having a target thickness. In some embodiments, a second channel layer having a target thickness may be formed on the sidewall and the bottom of the hole 126 without performing the trimming process.

Then, processes may be substantially the same as or similar to the processes illustrated with reference to FIG. 11 may be performed. Thus, a channel structure 155 and the filling insulation pattern 156 may be formed in the hole 126.

In some embodiments, the channel structure 155 may include a first channel pattern 146*a*, a second channel pattern 148*a* and a silicon pattern 154.

A portion of the channel structure 155 on the semiconductor pattern 130 may include the second channel pattern 154 and the silicon pattern 154 sequentially stacked, and may have a fifth thickness d5 in the first direction from the upper surface of the semiconductor pattern 130. A portion of the channel structure 155 on the sidewall of the tunnel insulation pattern 144*a* may include the first and second channel patterns 146*a* and 148*a* sequentially stacked, and may have a sixth thickness d6 in the third direction. The fifth thickness d5 may be substantially the same as or greater than the sixth thickness d6.

The second channel pattern 148*a* and the silicon pattern 154 may serve as an upper channel pattern. An upper surface of the upper channel pattern on the semiconductor pattern 130 may be higher than a lower surface of the first channel pattern 146*a*.

Then, processes may be substantially the same as or similar to the processes illustrated with reference to FIGS. 12 and 16 may be performed, so that the vertical type semiconductor device shown in FIG. 22 may be manufactured.

Figure 23:
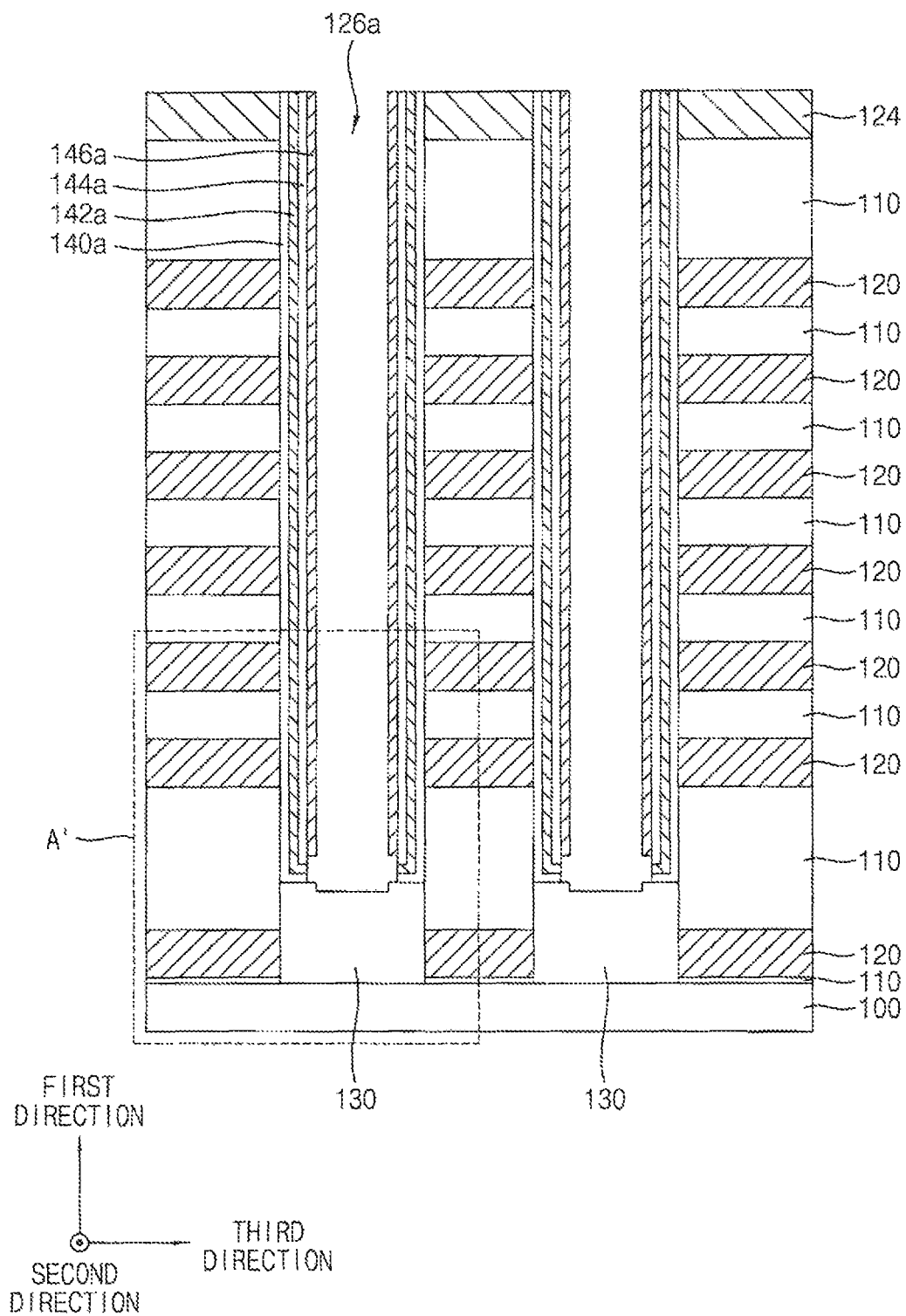
Figure 24:
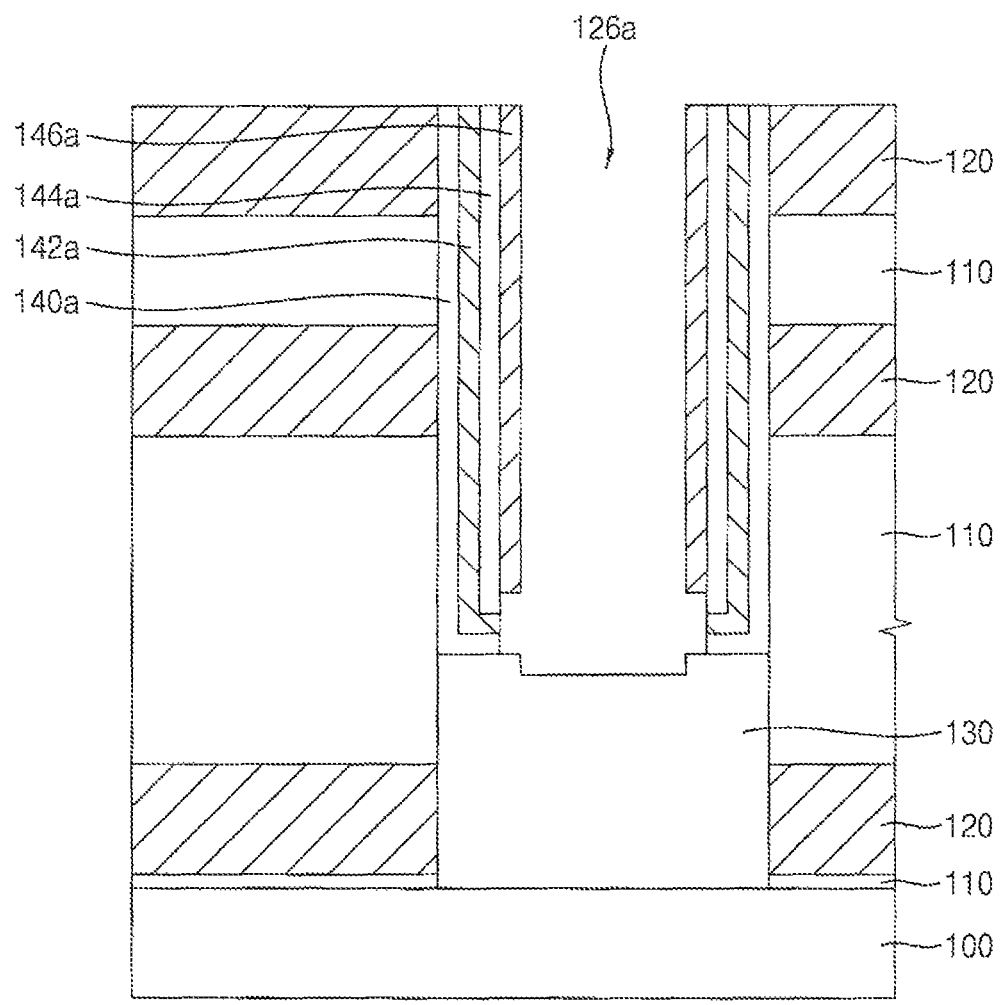
Figure 25:
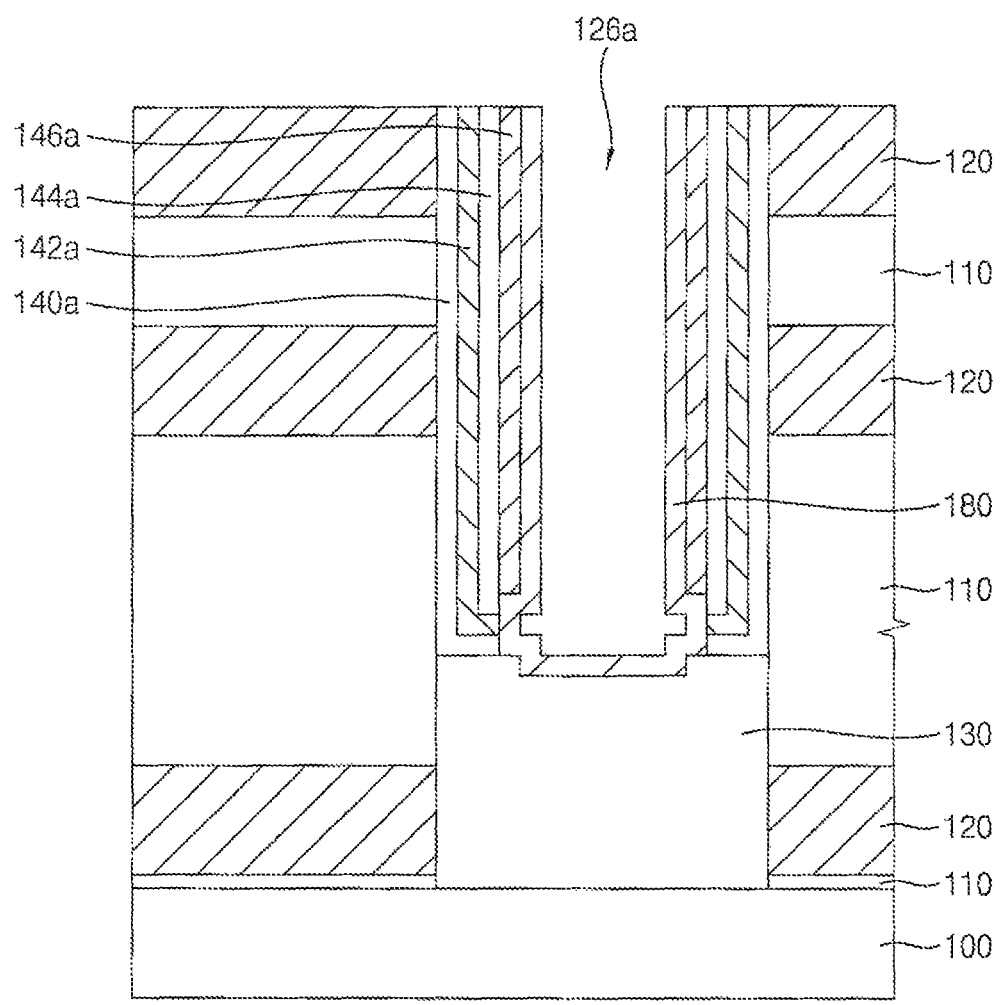
Figure 26:
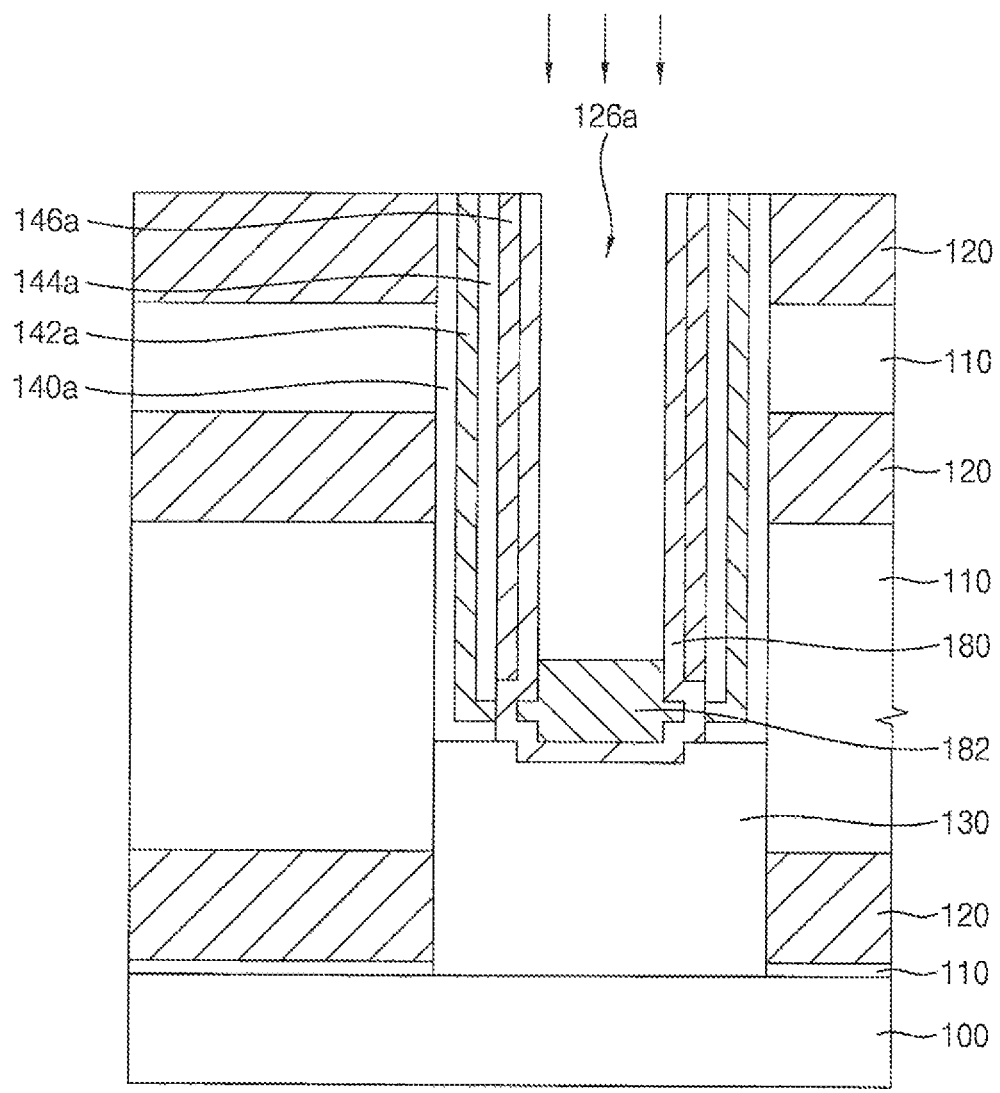

FIGS. 23 to 27 are cross-sectional views illustrating stages of a method of manufacturing a vertical semiconductor device in accordance with some embodiments. FIGS. 24 to 26 are enlarged views of a portion of the vertical semiconductor device.

The vertical semiconductor device may be manufactured by processes substantially the same as or similar to processes illustrated with reference to FIGS. 2 and 16.

First, processes may be substantially the same as or similar to the processes illustrated with reference to FIGS. 2 and 6 may be performed. Thus, the first blocking pattern 140*a*, the charge storage pattern 142*a*, the tunnel insulation pattern 144*a* and the first channel pattern 146*a* may be formed on a sidewall of the hole 126. The semiconductor pattern 130 may be exposed by the hole 126.

Referring to FIGS. 23 and 24, the first blocking pattern 140*a*, the charge storage pattern 142*a* and the tunnel insulation pattern 144*a* exposed by a lower portion of the hole 126 may be partially and isotropically etched to form a first hole 126*a* having an enlarged width under the first channel pattern 146*a*.

Referring to FIG. 25, a preliminary second channel layer may be conformally formed on the first channel pattern 146a, the first blocking pattern 140a, the charge storage pattern 142a, the tunnel insulation pattern 144a and the semiconductor pattern 130 exposed by the first hole 126a and hard mask 124. A surface of the preliminary second channel layer may be partially etched by a trimming process to form a second channel layer 180 having a target thickness.

The second channel layer 180 may be formed by performing processes substantially the same as the processes illustrated with reference to FIGS. 7 and 8.

Referring to FIG. 26, impurities including silicon may be implanted to the second channel layer 180 in the first direction to form a silicon pattern 182. The silicon pattern 182 may be formed on a portion of the second channel layer 180 on the semiconductor pattern 130.

The silicon pattern 182 may completely cover the second portions of the first blocking pattern 140a, the charge storage pattern 142a and the tunnel insulation pattern 144a. That is, an upper surface of the silicon pattern 182 may be higher than a lower surface of the first channel pattern 146a.

Figure 27:
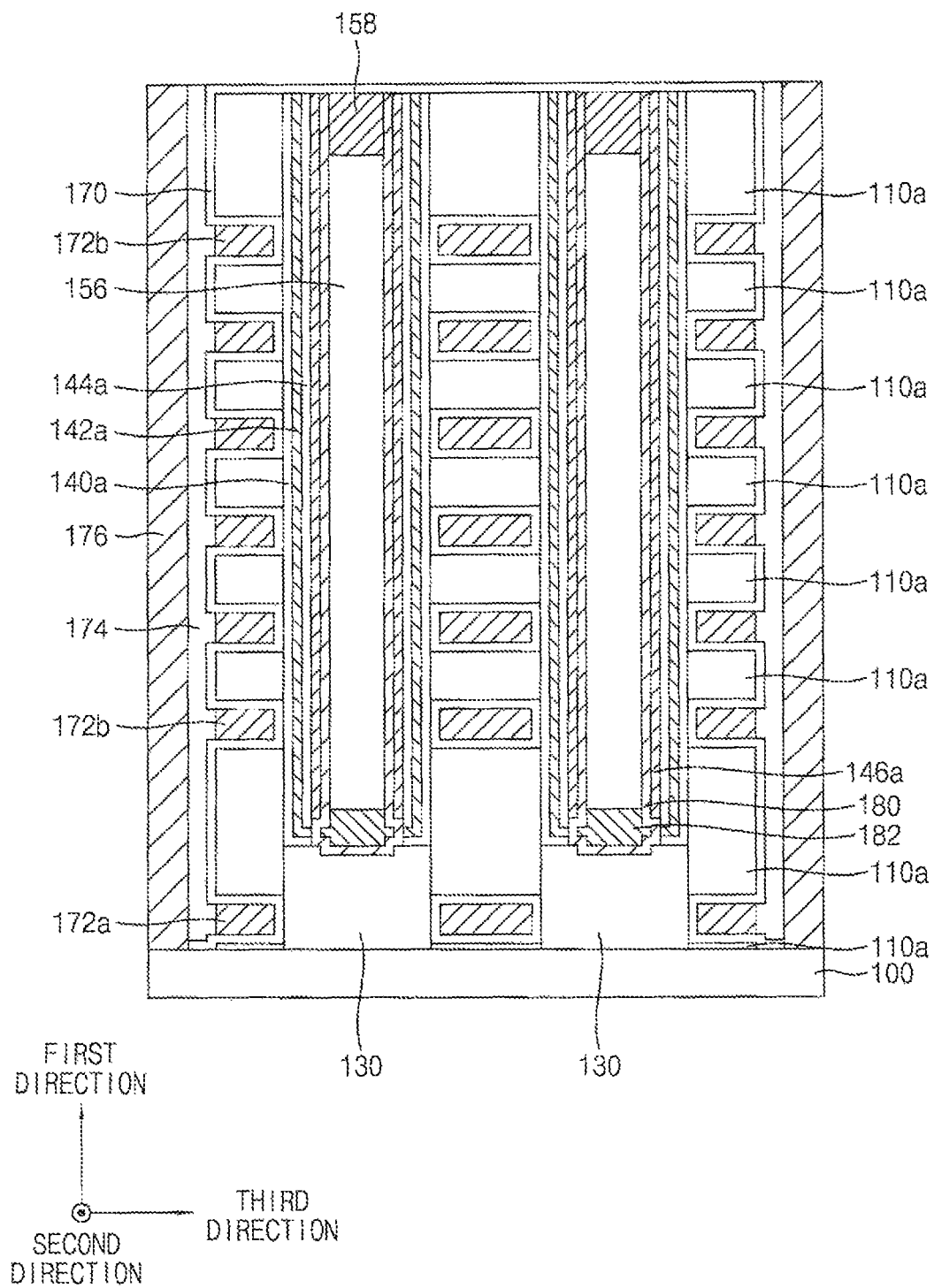

Then, processes may be substantially the same as or similar to the processes illustrated with reference to FIGS. 11 to 16 may be performed, so that the vertical semiconductor device shown in FIG. 27 may be manufactured.

Figure 28:
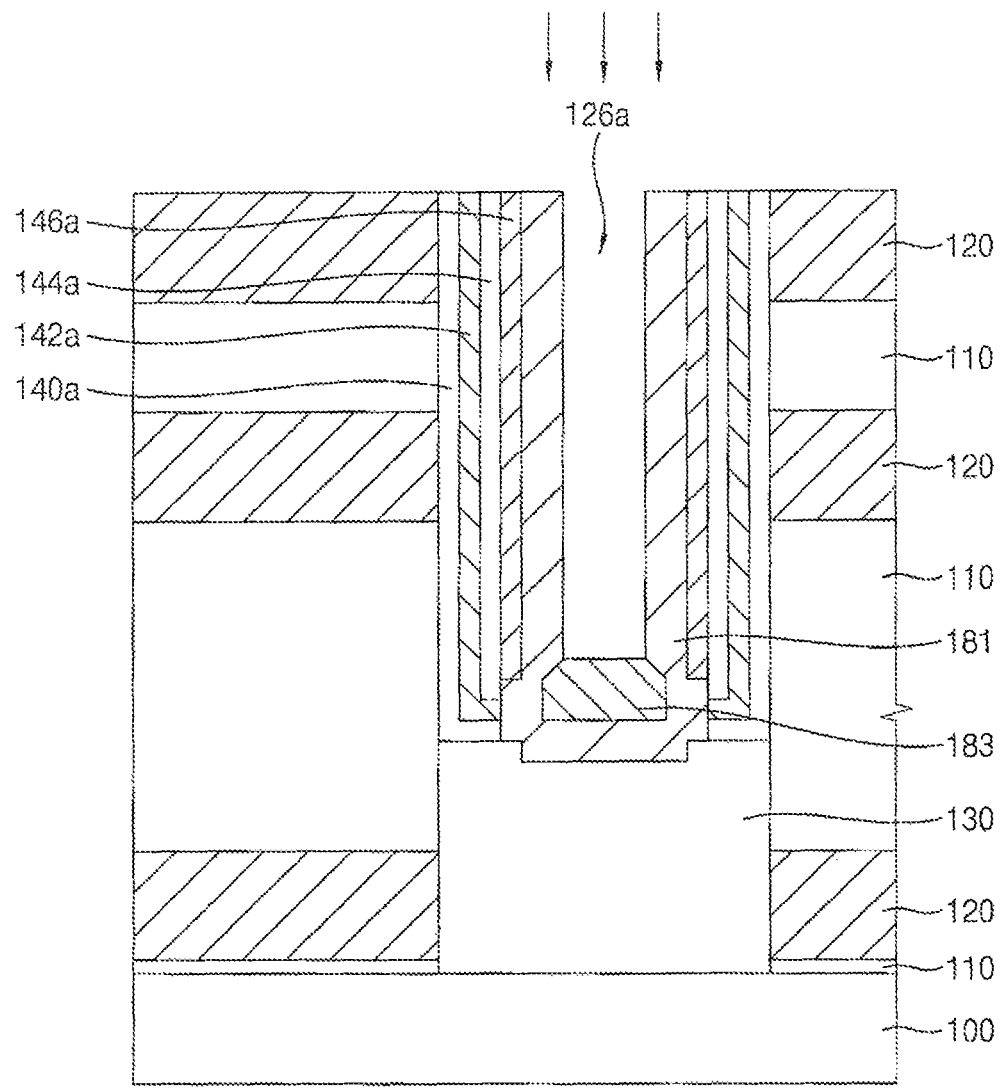
Figure 29:
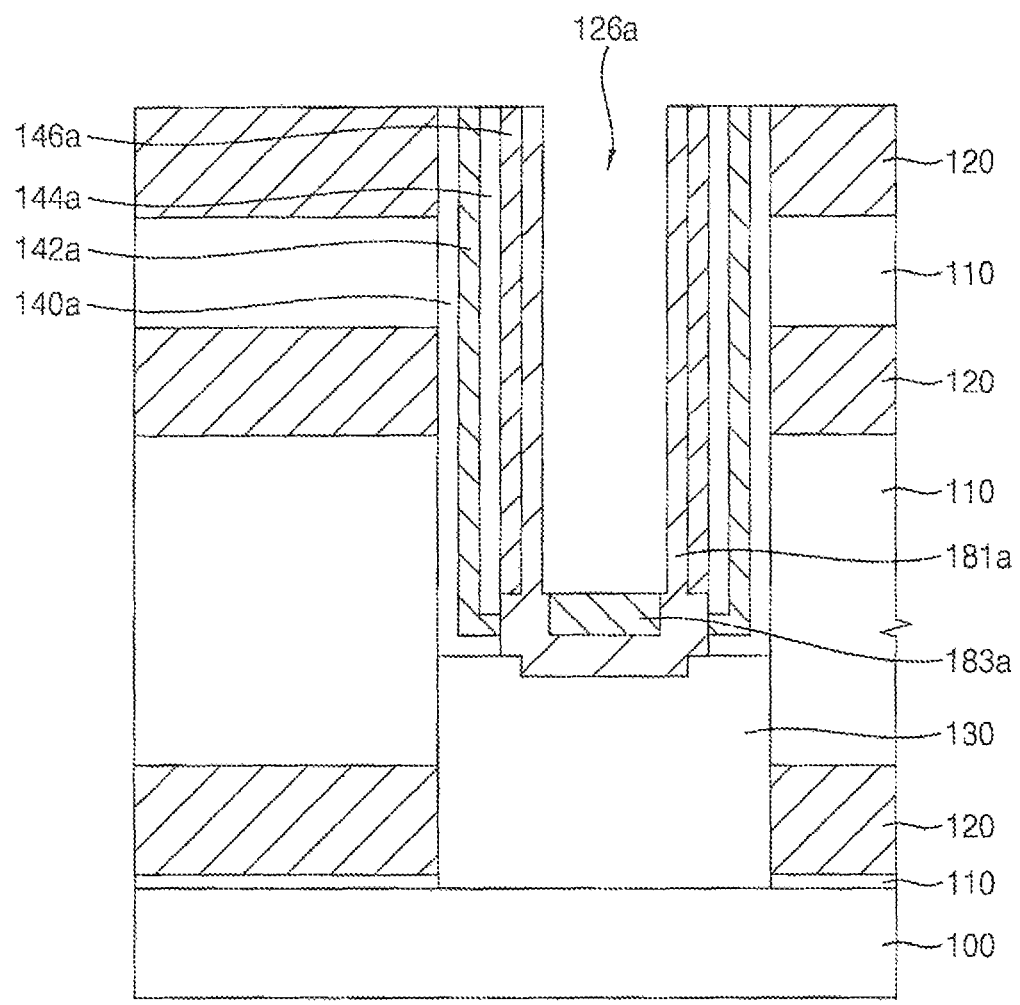

FIGS. 28 and 29 are cross-sectional views illustrating stages of a method of manufacturing a semiconductor device in accordance with some embodiments. FIGS. 28 and 29 are enlarged views of a portion of the vertical semiconductor device.

First, processes may be substantially the same as or similar to the processes illustrated with reference to FIGS. 2 and 6 may be performed. Thus, the first blocking pattern 140a, the charge storage pattern 142a, the tunnel insulation pattern 144a and the first channel pattern 146a may be formed on a sidewall of the hole 126. The semiconductor pattern 130 may be exposed by the hole 126.

The first blocking pattern 140a, the charge storage pattern 142a and the tunnel insulation pattern 144a exposed by a lower portion of the hole 126 may be partially and isotropically etched to form a first hole 126a having an enlarged width under the first channel pattern 146a, as shown in FIGS. 23 and 24.

Referring to FIG. 28, a preliminary second channel layer 181 may be conformally formed on the first channel pattern 146a, the first blocking pattern 140a, the charge storage pattern 142a, the tunnel insulation pattern 144a and the semiconductor pattern 130 exposed by the first hole 126a and hard mask 124. The preliminary second channel layer 181 may be crystallized by an annealing process.

Impurities including silicon may be implanted to the preliminary second channel layer 121 in the first direction to form a preliminary silicon pattern 183. The preliminary silicon pattern 183 may be formed on a portion of the preliminary second channel layer 121 on the semiconductor pattern 130. The preliminary silicon pattern 183 may be formed by performing processes substantially the same as the processes illustrated with reference to FIG. 17.

In some embodiments, the preliminary silicon pattern 183 may fill a lower portion having an enlarged width of the first hole 126a.

Referring to FIG. 29, surfaces of the preliminary second channel layer 181 and the preliminary silicon pattern 183 may be partially etched by a trimming process to form a second channel layer 181a having a target thickness. In some embodiments, after the trimming process, a portion of the preliminary silicon pattern 183 may remain on the second channel layer 181a to form a silicon pattern. In some embodiments, during the trimming process, the preliminary silicon pattern 183a may be completely removed, so that a silicon pattern may not be formed on the second channel layer 181a.

The second channel layer 181a may be formed by performing processes substantially the same as the processes illustrated with reference to FIG. 18.

Then, processes may be substantially the same as or similar to the processes illustrated with reference to FIGS. 11 to 16 may be performed, so that the vertical semiconductor device may be manufactured.

Figure 30:
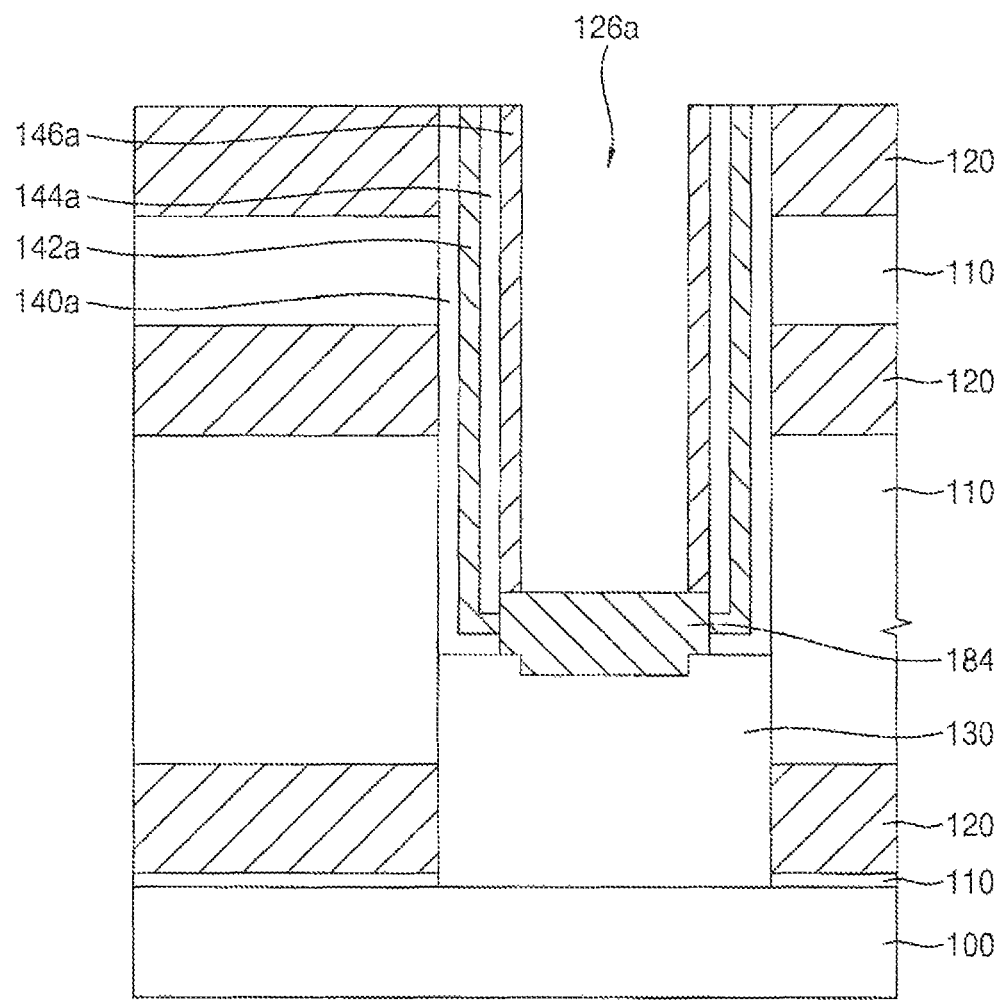
Figure 31:
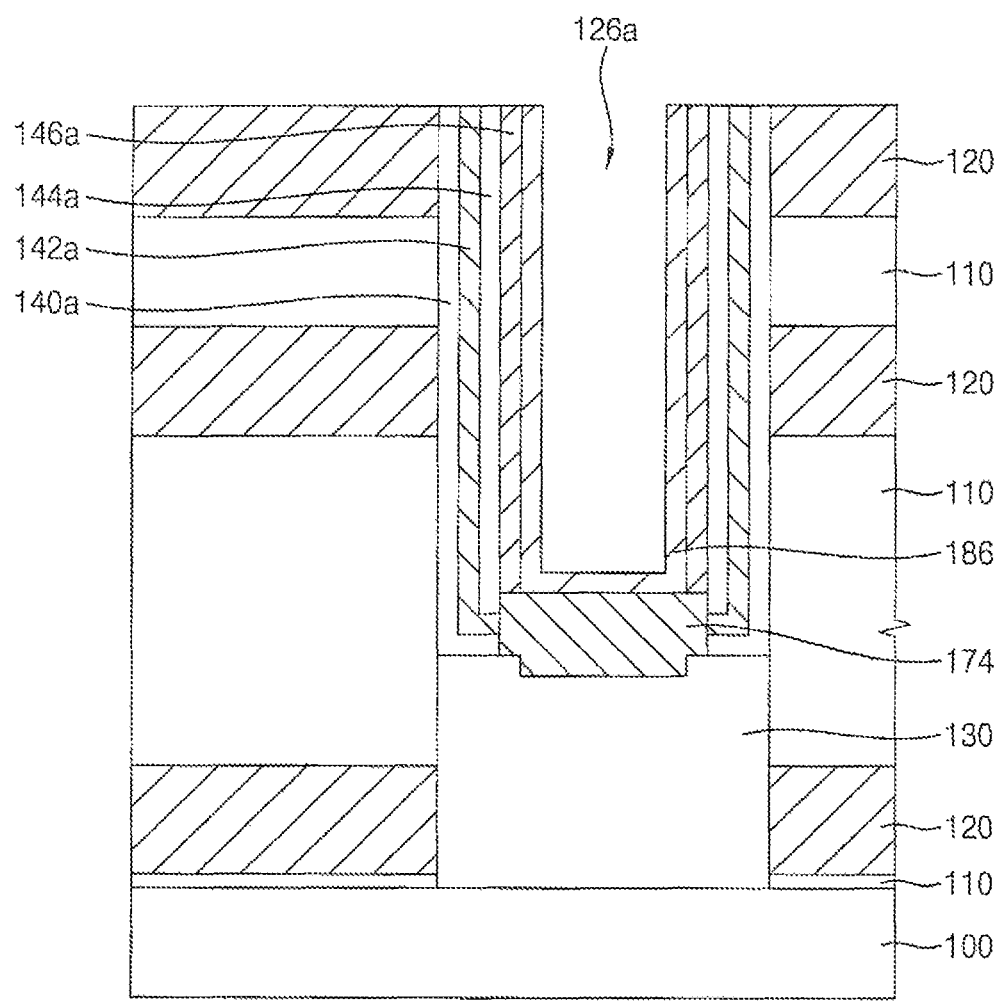

FIGS. 30 and 31 are cross-sectional views illustrating stages of a method of manufacturing a vertical semiconductor device in accordance with some embodiments. FIGS. 30 and 31 are enlarged views of a portion of the vertical semiconductor device.

First, processes may be substantially the same as or similar to the processes illustrated with reference to FIGS. 2 and 6 may be performed. Thus, the first blocking pattern 140a, the charge storage pattern 142a, the tunnel insulation pattern 144a and the first channel pattern 146a may be formed on a sidewall of the hole 126. The semiconductor pattern 130 may be exposed by the hole 126.

The first blocking pattern 140a, the charge storage pattern 142a and the tunnel insulation pattern 144a exposed by a lower portion of the hole 126 may be partially and isotropically etched to form a first hole 126a having an enlarged width under the first channel pattern 146a, as shown in FIGS. 23 and 24.

Referring to FIG. 30, a silicon pattern 184 may be formed on the semiconductor pattern 130 in the first hole 126a.

In some embodiments, impurities including silicon may be implanted to the semiconductor pattern 130 in the first direction to form the silicon pattern 184. The impurities may not be doped into the first channel pattern 146a, so that the silicon pattern 184 may be formed on the semiconductor pattern 130.

In some embodiments, the silicon pattern 184 may be formed by a selective epitaxial growth (SEG) process using the exposed upper surface of the semiconductor pattern 130 as a seed. In this case, the silicon pattern 184 may include, e.g., crystalline silicon.

Referring to FIG. 31, a second channel layer 186 may be formed on the sidewall and a bottom of the first hole 126a to cover the silicon pattern 184 and the first channel pattern 146a.

In some embodiments, a preliminary second channel layer may be formed on the sidewall and the bottom of the first hole 126a. A surface of the preliminary second channel layer may be partially etched by a trimming process to form a second channel layer 186 having a target thickness. In some embodiments, a second channel layer 186 having a target thickness may be formed on the sidewall and the bottom of the first hole 126a without performing the trimming process.

Then, processes may be substantially the same as or similar to the processes illustrated with reference to FIGS. 11 to 16 may be performed, so that the vertical semiconductor device may be manufactured.

Figure 32:
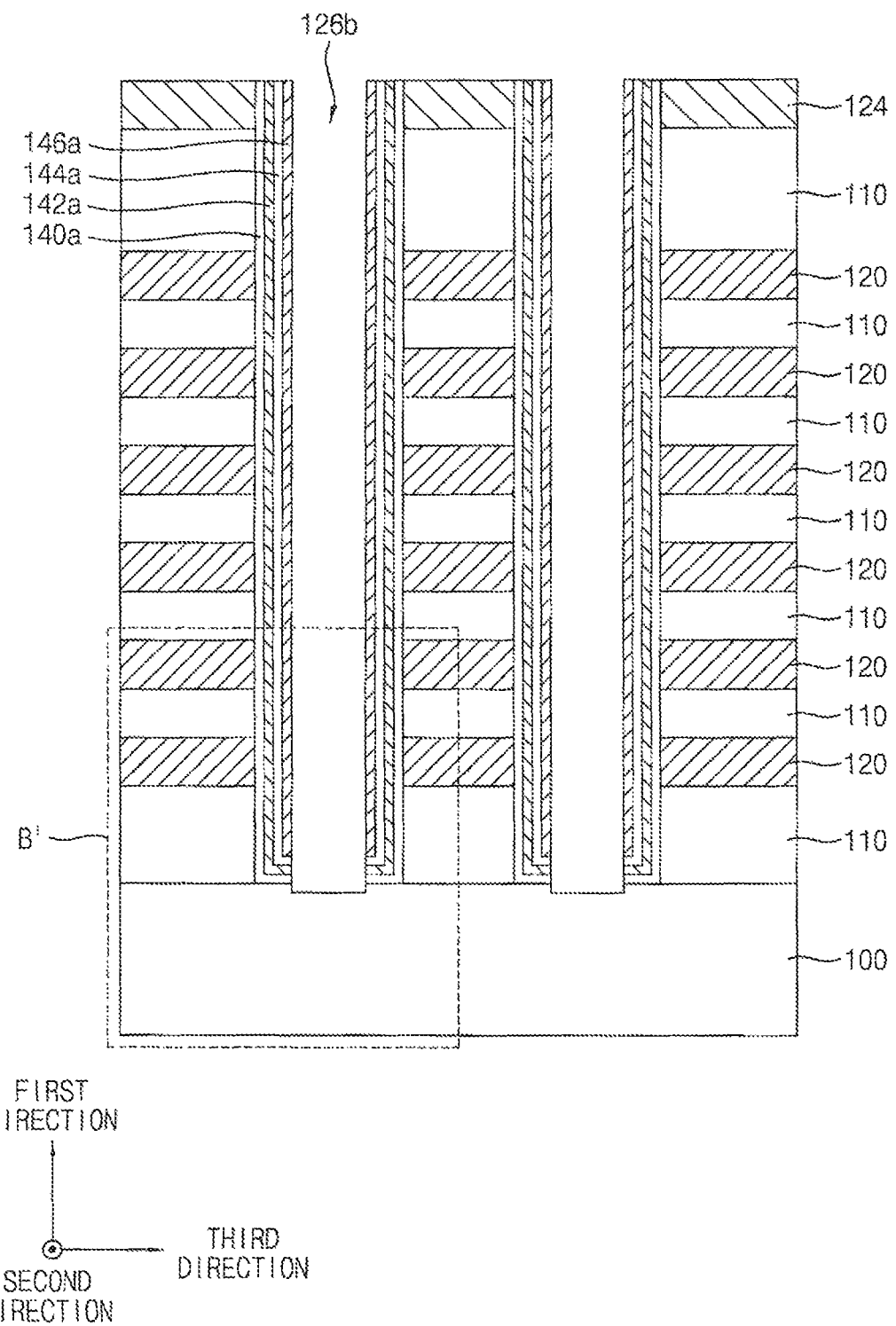
Figure 33:
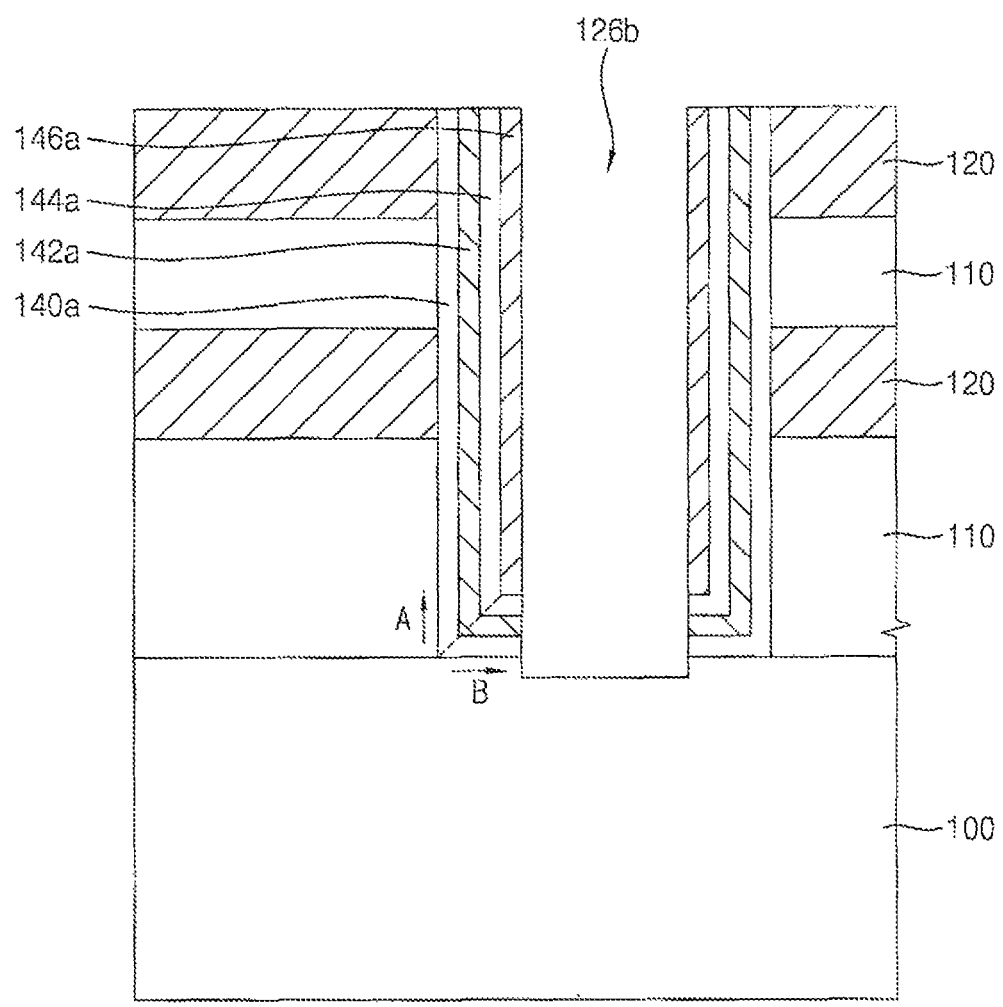
Figure 34:
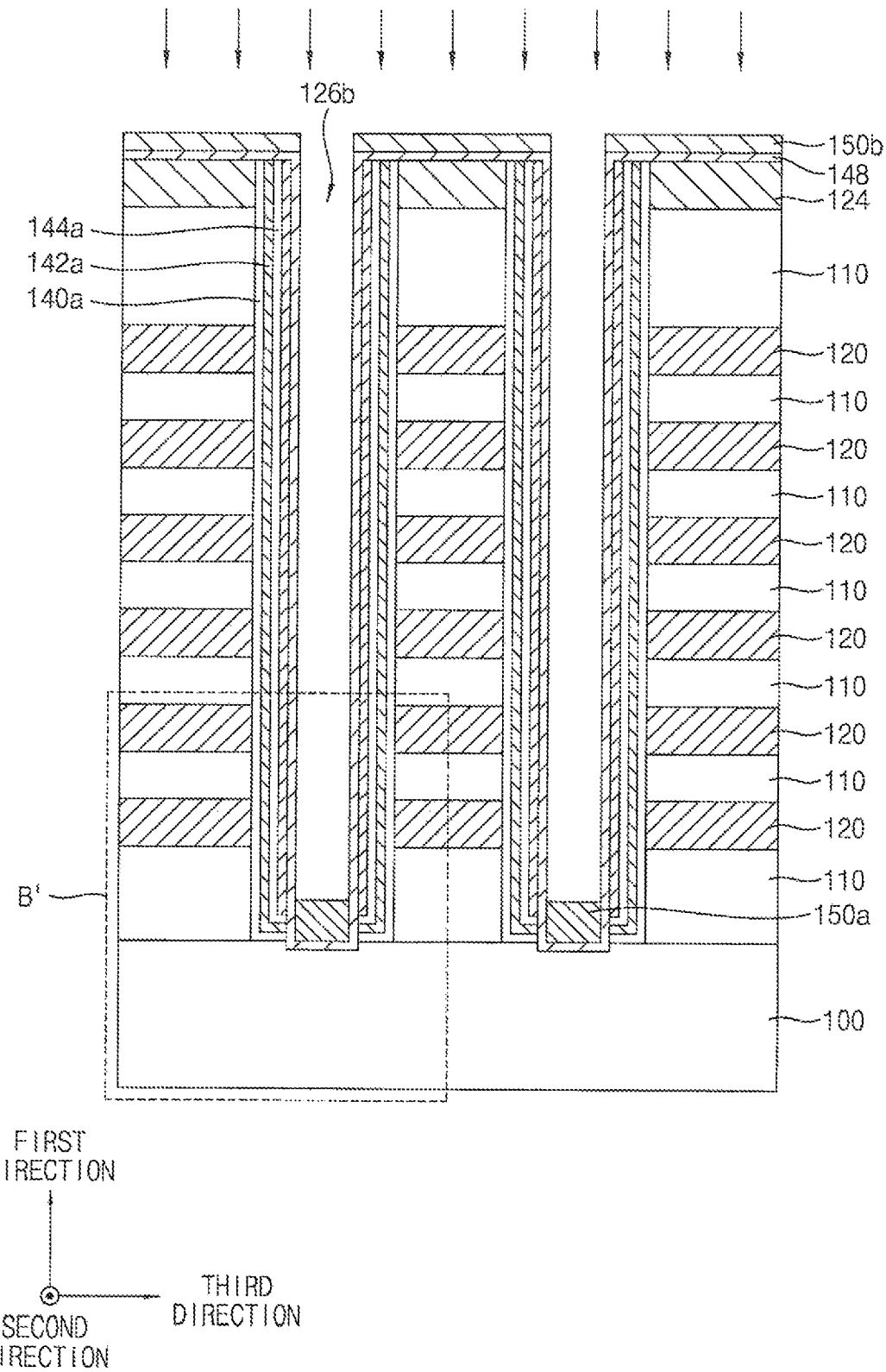
Figure 35:
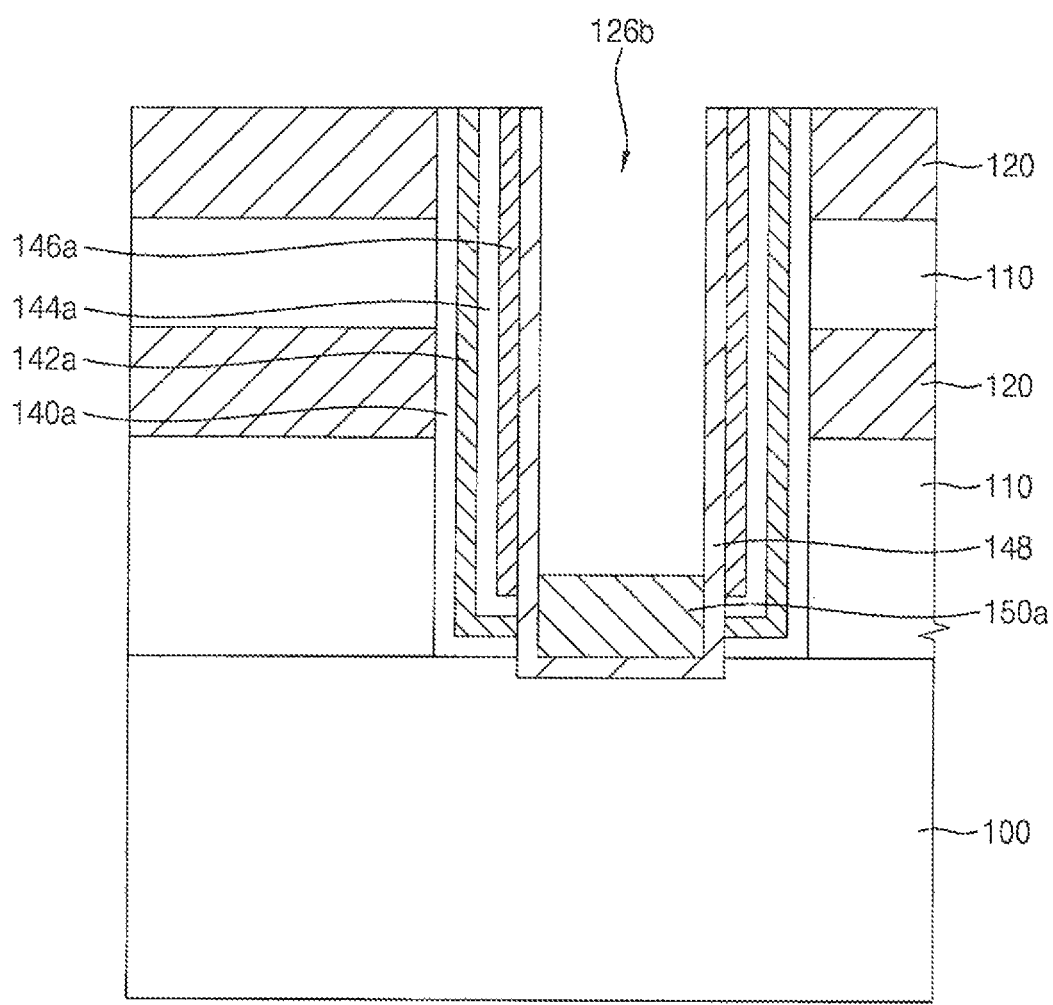

FIGS. 32 to 36 are cross-sectional views illustrating stages of a method of manufacturing a vertical semiconductor device in accordance with some embodiments. FIGS. 33 and 35 are enlarged views of a portion of the vertical semiconductor device.

In the vertical semiconductor device, the channel structure may directly contact the substrate without a semiconductor pattern.

Referring to FIGS. 32 and 33, a plurality of first insulation layers 110 and a plurality of first sacrificial layers 120 may be repeatedly and alternately formed on the substrate 100 to form a mold structure. A hard mask 124 may be formed on the mold structure. The mold structure may be etched using the hard mask 124 as an etching mask to form a plurality of holes 126b exposing an upper surface of the substrate 100. A blocking layer, a charge storage layer, a tunnel insulation layer and a first channel layer may be sequentially and conformally formed on a sidewall of the hole 126b, the upper surface of the substrate 100 and the hard mask 124. The first channel layer, the tunnel insulation layer, the charge storage layer and blocking layer may be anisotropically etched to expose the upper surface of the substrate, so that a first blocking pattern 140a, a charge storage pattern 142a, a tunnel insulation pattern 144a and the first channel pattern 146a may be formed.

The processes may be substantially the same as or similar to processes illustrated with reference to FIGS. 2 to 6, however, a semiconductor pattern may not be formed in the holes 126b.

Referring to FIGS. 34 and 35, a preliminary second channel layer may be conformally formed on the second portions of the first blocking pattern 140a, the charge storage pattern 142a and the tunnel insulation pattern 144a, the substrate 100 and the hard mask 124. A surface of the preliminary second channel layer may be partially etched by a trimming process to form a second channel layer 148 having a target thickness. Impurities including silicon may be implanted to the second channel layer 148 in the first direction to form a silicon pattern 150a. The silicon pattern may be formed on a portion of the second channel layer 148 on the substrate 100.

The processes may be substantially the same as or similar to processes illustrated with reference to FIGS. 7 to 10.

Figure 36:
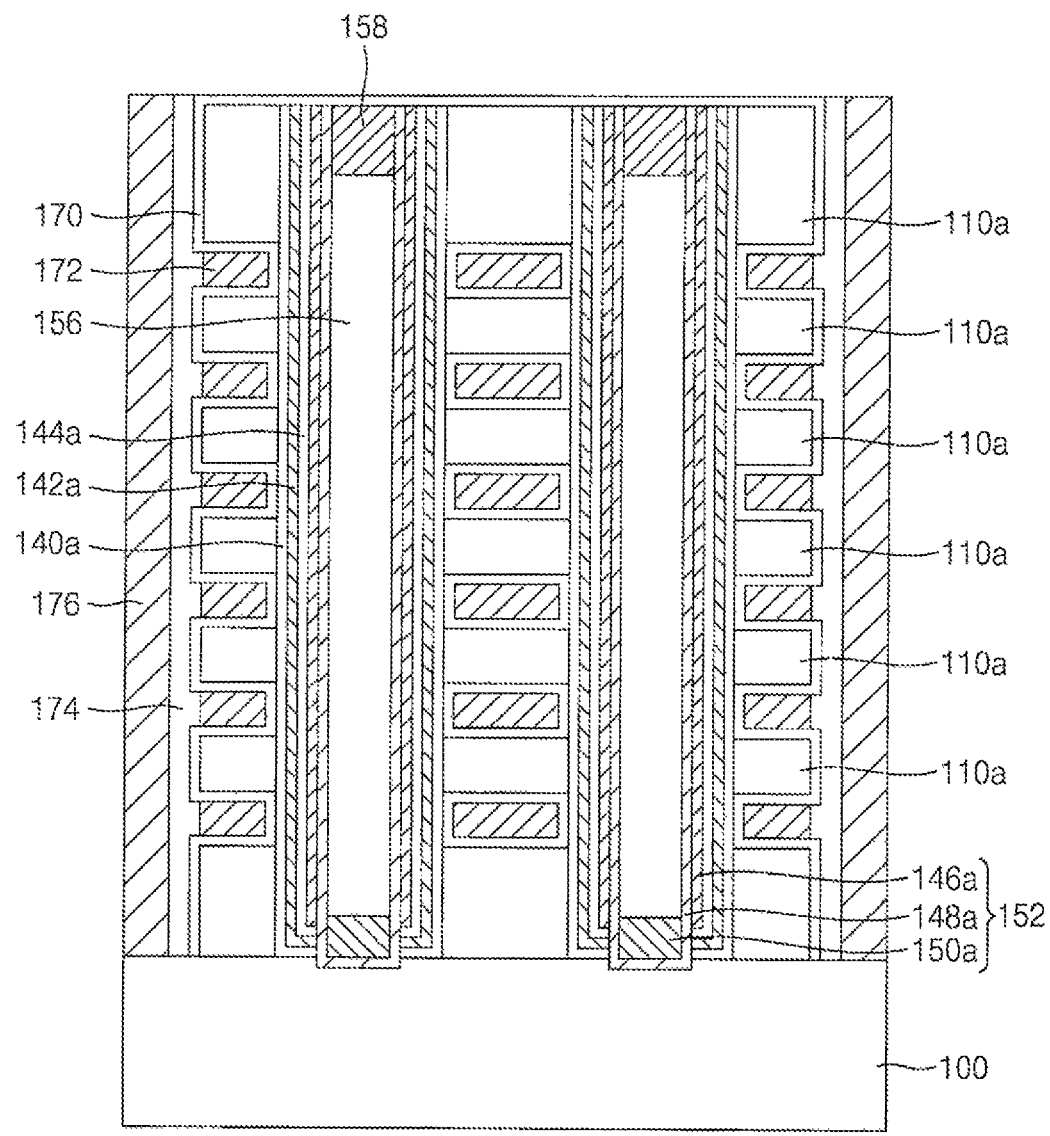
Figure 36:
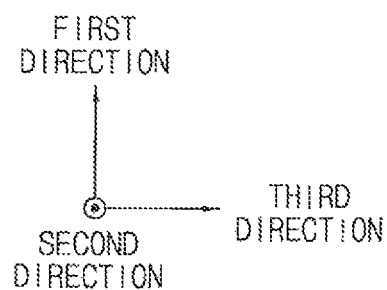

Then, processes may be substantially the same as or similar to the processes illustrated with reference to FIGS. 11 to 16 may be performed, so that the vertical type semiconductor device shown in FIG. 36 may be manufactured.

As described above, the semiconductor pattern may be formed on the substrate, so that the channel structure and the substrate may directly contact the substrate. Thus, various type vertical semiconductor devices having a structure directly contacting the channel structure and the substrate may be formed.

In some embodiments, in the semiconductor device, disconnection between the semiconductor pattern or the substrate and the channel pattern may decrease. The above semiconductor device may be applied to various types of systems, e.g., computing system.

While some embodiments have been particularly shown and described, it will be understood by one of ordinary skill in the art that variations in form and detail may be made therein without departing from the spirit and scope of the claims.

What is claimed is:

1. A vertical semiconductor device, comprising:
a structure including a plurality of insulation layers and gates alternately stacked on a substrate, and the structure having a hole exposing an upper surface of the substrate;
a semiconductor pattern formed in a lower portion of the hole on the substrate;
a blocking pattern, a charge storage pattern, a tunnel insulation pattern and a first channel pattern stacked on a sidewall of the hole; and
an upper channel pattern including a second channel pattern and a silicon pattern, wherein the second channel pattern is formed on the first channel pattern and the semiconductor pattern, and the silicon pattern is formed in the lower portion of the hole and contacts the second channel pattern disposed at an upper surface of the semiconductor pattern,
wherein an upper surface of the upper channel pattern disposed on the semiconductor pattern is higher than a lower surface of the first channel pattern.

2. The vertical semiconductor device of claim 1, wherein the second channel pattern directly contacts the upper surface of the semiconductor pattern.

3. The vertical semiconductor device of claim 2, wherein the silicon pattern is formed on the second channel pattern.

4. The vertical semiconductor device of claim 1, wherein the silicon pattern directly contacts the upper surface of the semiconductor pattern.

5. The vertical semiconductor device of claim 4, wherein the second channel pattern is formed on the silicon pattern.

6. The vertical semiconductor device of claim 1, wherein the first channel pattern and the upper channel pattern serve as a channel structure, and a first thickness of a portion of the channel structure on the semiconductor pattern is greater than a second thickness of a portion of the channel structure on the sidewall of the hole.

7. The vertical semiconductor device of claim 1, wherein the silicon pattern includes amorphous silicon or crystalline silicon.

8. The vertical semiconductor device of claim 1, wherein the first channel pattern and the upper channel pattern serve as a channel structure, and further comprising a filling insulation pattern on the channel structure to fill the hole.

9. The vertical semiconductor device of claim 1, wherein a material of the first channel pattern is substantially the same as a material of the second channel pattern.

10. The vertical semiconductor device of claim 1, wherein the first channel pattern and the second channel pattern include polysilicon.

11. A vertical semiconductor device, comprising:
a structure on a substrate, the structure including a plurality of insulation layers and sacrificial layers alternately stacked, and the structure having a hole exposing a surface of the substrate;
a first semiconductor pattern on the substrate in a lower portion of the hole;
a blocking pattern, a charge storage pattern and a tunnel insulation pattern on a sidewall of the hole;
a channel structure formed on the first semiconductor pattern and the tunnel insulation pattern in the hole, the channel structure including a first portion on the first semiconductor pattern having a first thickness and a second portion on the tunnel insulation pattern having a second thickness less than the first thickness; and
wherein the second portion of the channel structure includes a first channel pattern and a second channel pattern, and the first portion of the channel structure includes the second channel pattern and a second semiconductor pattern.

12. The vertical semiconductor device of claim 11, wherein
the first channel pattern is formed on the tunnel insulation pattern,
the second channel pattern is formed on the first channel pattern and the first semiconductor pattern, and the second semiconductor pattern contacts a portion of the second channel pattern formed on the first semiconductor pattern.

13. The vertical semiconductor device of claim 12, wherein the second channel pattern and the second semiconductor pattern serve as an upper channel pattern, and an upper surface of the of the upper channel pattern disposed on the first semiconductor pattern is higher than a lower surface of the first channel pattern.

14. The vertical semiconductor device of claim 11, further comprising a filling insulation pattern on the channel structure to fill the hole.

15. The vertical semiconductor device of claim 11, wherein the second semiconductor pattern includes amorphous silicon or crystalline silicon.

16. The vertical semiconductor device of claim 11, wherein the first channel pattern and the second channel pattern include polysilicon.

17. A vertical semiconductor device, comprising:
   a structure on a substrate, the structure including a plurality of insulation layers and sacrificial layers alternately stacked, and the structure having a hole exposing a surface of the substrate;
   a semiconductor pattern on the substrate in a lower portion of the hole;
   a blocking pattern, a charge storage pattern and a tunnel insulation pattern on a sidewall of the hole; and
   a channel structure formed on the semiconductor pattern and the tunnel insulation pattern in the hole, the channel structure including a first portion on the semiconductor pattern and a second portion on the tunnel insulation pattern,
   wherein the second portion of the channel structure includes a first channel pattern and a second channel pattern, and the first portion of the channel structure includes the second channel pattern and a second semiconductor pattern, and
   wherein the second semiconductor pattern includes silicon, and the first channel pattern and the second channel pattern include polysilicon.

18. The vertical semiconductor device of claim 17, wherein the first portion of the channel structure has a first thickness, and the second portion of the channel structure has a second thickness less than the first thickness.

19. The vertical semiconductor device of claim 17, wherein the silicon of the first portion includes amorphous silicon or crystalline silicon.

20. The vertical semiconductor device of claim 1, further comprising a pad formed in an upper portion of the hole.

* * * * *